(12) United States Patent
Benoit et al.

(10) Patent No.: US 7,780,470 B2
(45) Date of Patent: *Aug. 24, 2010

(54) PLUG TAIL LIGHTING SWITCH AND CONTROL SYSTEM

(75) Inventors: John Benoit, Montpelier, VT (US); Gerald R. Savicki, Jr., Canastota, NY (US); Richard Weeks, Little York, NY (US)

(73) Assignee: Pass & Seymour, Inc., Syracuse, NY (US)

( * ) Notice: Subject to any disclaimer, the term of this patent is extended or adjusted under 35 U.S.C. 154(b) by 75 days.

This patent is subject to a terminal disclaimer.

(21) Appl. No.: 12/123,866

(22) Filed: May 20, 2008

(65) Prior Publication Data
US 2009/0197461 A1 Aug. 6, 2009

Related U.S. Application Data

(63) Continuation-in-part of application No. 11/531,812, filed on Sep. 14, 2006, now Pat. No. 7,713,084, and a continuation-in-part of application No. 11/274,817, filed on Nov. 15, 2005, now Pat. No. 7,407,410, said application No. 11/531,812 is a continuation-in-part of application No. 11/032,420, filed on Jan. 10, 2005, now Pat. No. 7,189,110, and a continuation of application No. 10/680,797, filed on Oct. 7, 2003, now Pat. No. 6,994,585.

(51) Int. Cl.
H01R 13/60 (2006.01)

(52) U.S. Cl. ........................................ 439/535; 439/536

(58) Field of Classification Search .................. 439/535, 439/536, 650; 174/48, 66, 67, 50, 53, 68; 220/241
See application file for complete search history.

(56) References Cited

U.S. PATENT DOCUMENTS 2,433,917 A 1/1948 McCartney (Continued)

OTHER PUBLICATIONS

Richter et al., Practical Electrical Wiring,1993, 16th Edition, McGraw-Hill, U.S.; pp. 137-139, 176-177, 507-510.

(Continued)

*Primary Examiner*—Tho D Ta
(74) *Attorney, Agent, or Firm*—Daniel P. Malley; Bond, Schoeneck & King, PLLC

(57) ABSTRACT

The present invention is directed to an electrical wiring system for use in an AC electrical power distribution circuit including at least one first AC power conductor disposed between an upstream AC power element and a device box and at least one second AC power conductor disposed between the device box and a downstream AC power element. The at least one first AC power conductor and the at least one second AC power conductor are routed into an interior portion of the device box and accessible via a front open face of the device box. The system includes a connector device including a connector housing having a plurality of connector contacts disposed therein.

The plurality of connector contacts are coupled to termination structures configured to couple the at least one first AC power conductor and the at least one second AC power conductor to corresponding contacts of the plurality of connector contacts. An electrical wiring device includes a device housing having a front portion and a rear portion. The front portion includes at least one user-accessible control element disposed thereon. The at least one user-accessible control element is coupled to an electrical switch mechanism disposed in the device housing and coupled to a plurality of device contacts. The plurality of device contacts are accessible by way of a device connection arrangement formed in the rear portion of the device housing. The plurality of device contacts are configured to mate with the plurality of connector contacts when the connector device is coupled to the device connection arrangement.

42 Claims, 14 Drawing Sheets

U.S. PATENT DOCUMENTS

| | | | |
|---|---|---|---|
| 2,895,119 | A | 7/1959 | Montgomery, Jr. |
| 3,156,761 | A | 11/1964 | Schinske |
| 3,192,499 | A | 6/1965 | West |
| 3,369,211 | A | 2/1968 | Sundquist |
| 3,641,472 | A | 2/1972 | Phillips, Jr. |
| 3,879,101 | A | 4/1975 | McKissic |
| 3,952,244 | A | 4/1976 | Spear |
| 3,967,195 | A | 6/1976 | Averitt |
| 3,975,074 | A | 8/1976 | Fuller |
| 3,975,075 | A | 8/1976 | Mason |
| 4,008,940 | A | 2/1977 | Foley |
| 4,015,201 | A | 3/1977 | Chaffee |
| 4,034,284 | A | 7/1977 | Peplow |
| 4,082,995 | A | 4/1978 | Rhude |
| 4,105,968 | A | 8/1978 | Mobley |
| 4,118,690 | A | 10/1978 | Paynton |
| 4,127,807 | A | 11/1978 | Peplow |
| 4,152,639 | A | 5/1979 | Chaffee |
| 4,203,638 | A | 5/1980 | Tansi |
| 4,217,619 | A | 8/1980 | Tibolla |
| 4,273,957 | A | 6/1981 | Kolling |
| 4,280,092 | A | 7/1981 | Wells, Jr. |
| 4,477,141 | A | 10/1984 | Hardesty |
| 4,485,282 | A | 11/1984 | Lee |
| 4,725,249 | A | 2/1988 | Blackwood |
| 4,725,429 | A | 2/1988 | Scott et al. |
| 4,842,551 | A | 6/1989 | Heimann |
| 4,865,556 | A | 9/1989 | Campbell et al. |
| 5,006,075 | A | 4/1991 | Bowden, Jr. |
| 5,015,203 | A | 5/1991 | Furrow |
| 5,117,122 | A | 5/1992 | Hogarth |
| 5,146,385 | A | 9/1992 | Misencik |
| 5,178,555 | A | 1/1993 | Kilpatrick et al. |
| 5,224,009 | A | 6/1993 | Misencik |
| 5,266,039 | A | 11/1993 | Boyer et al. |
| 5,281,154 | A | 1/1994 | Comerci et al. |
| 5,285,163 | A | 2/1994 | Liotta |
| 5,297,973 | A | 3/1994 | Gorman |
| 5,456,373 | A | 10/1995 | Ford |
| 5,472,350 | A | 12/1995 | Mehta |
| 5,582,522 | A | 12/1996 | Johnson |
| 5,625,285 | A | 4/1997 | Virgilio |
| 5,642,052 | A | 6/1997 | Earle |
| 5,654,857 | A | 8/1997 | Gershen |
| 5,785,551 | A | 7/1998 | Libby |
| 5,839,908 | A | 11/1998 | Bonilla |
| 5,876,243 | A * | 3/1999 | Sangawa .................. 439/519 |
| 5,964,618 | A | 10/1999 | McCarthy |
| 6,028,268 | A | 2/2000 | Stark et al. |
| 6,045,374 | A | 4/2000 | Candeloro |
| 6,054,849 | A | 4/2000 | Collier |
| 6,072,317 | A | 6/2000 | Mackenzie |
| 6,156,971 | A | 12/2000 | May |
| 6,218,844 | B1 | 4/2001 | Wong |
| 6,309,248 | B1 | 10/2001 | King |
| 6,323,652 | B1 | 11/2001 | Collier |
| 6,376,770 | B1 | 4/2002 | Hyde |
| 6,377,427 | B1 | 4/2002 | Haun et al. |
| 6,457,988 | B1 | 10/2002 | Andersen |
| 6,494,728 | B1 | 12/2002 | Gorman |
| 6,563,049 | B2 | 5/2003 | May |
| 6,657,144 | B1 | 12/2003 | Savicki, Jr. et al. |
| 6,692,284 | B1 | 2/2004 | Koh |
| 6,753,471 | B2 | 6/2004 | Johnson |
| 6,767,245 | B2 | 7/2004 | King |
| 6,774,307 | B2 | 8/2004 | Kruse |
| 6,814,611 | B1 | 11/2004 | Torres |
| 6,843,680 | B2 * | 1/2005 | Gorman .................. 439/535 |
| 6,870,099 | B1 | 3/2005 | Schultz et al. |
| 6,939,179 | B1 | 9/2005 | Kieffer, Jr. et al. |
| 6,982,558 | B2 | 1/2006 | Bryndzia |
| 6,994,585 | B2 | 2/2006 | Benoit |
| 7,057,401 | B2 | 6/2006 | Blades |
| 7,068,038 | B2 | 6/2006 | Mason |
| 7,091,723 | B2 | 8/2006 | Simmons |
| 7,195,517 | B2 | 3/2007 | Savicki, Jr. |
| 7,199,587 | B2 | 4/2007 | Hurwicz |
| 7,259,567 | B2 | 8/2007 | Sears |
| 2002/0052139 | A1 | 5/2002 | Gorman |
| 2002/0055301 | A1 | 5/2002 | Gorman |
| 2005/0006124 | A1 | 1/2005 | Kruse et al. |

OTHER PUBLICATIONS

Bryant Wiring Device Catalog BDB-1506, May 1994, pp. C12, D12, D16, F2 and F5.

Leviton Wiring Device Catalog, D-200, 1978, Little Neck, NY, pp. C1, T9, T12.

Pass & Seymour Plug Tail Wiring Devices Brochure; Apr. 2004.

First Alert, User's Manual for Smoke and Fire Alarms, Jul. 2004; Mexico, pp. 1-6.

Earley et al., NEC 1999 National Electrical Code Handbook, NFPA, 8th ed. (1999) pp. v-vii, 2, 69-70 and 98.

BRK Electronics, User's Manual—Smoke Alarms Jun. 2000.

T. Engdahl, Telephone Ringing Circuits, 1997, www.tkk.fi/misc/electronics/circuits/telephone_ringer.html.

P&S PlugTail Installation—Speed Comparison Video, Pass & Seymour website (www.passandseymour.com/plugtail/video.cfm, Jun. 2007.

BRK Electronics (First Alert), Model SC6120B—User's Manual for AC Powered Smoke and Carbon Monoxide Alarm with Batter Back-Up and Silence Feature, 2001.

NEC 2005 Handbook, 2005, Article 314-17, Conductors Entering Boxes, Conduit Bodies, or Fittings, National Fire Protection Association, Inc., p. 327.

UL Standard 514A, Metallic Outlet Boxes, Underwriters Laboratories Inc., Tenth Edition, 2004, p. 39.

\* cited by examiner

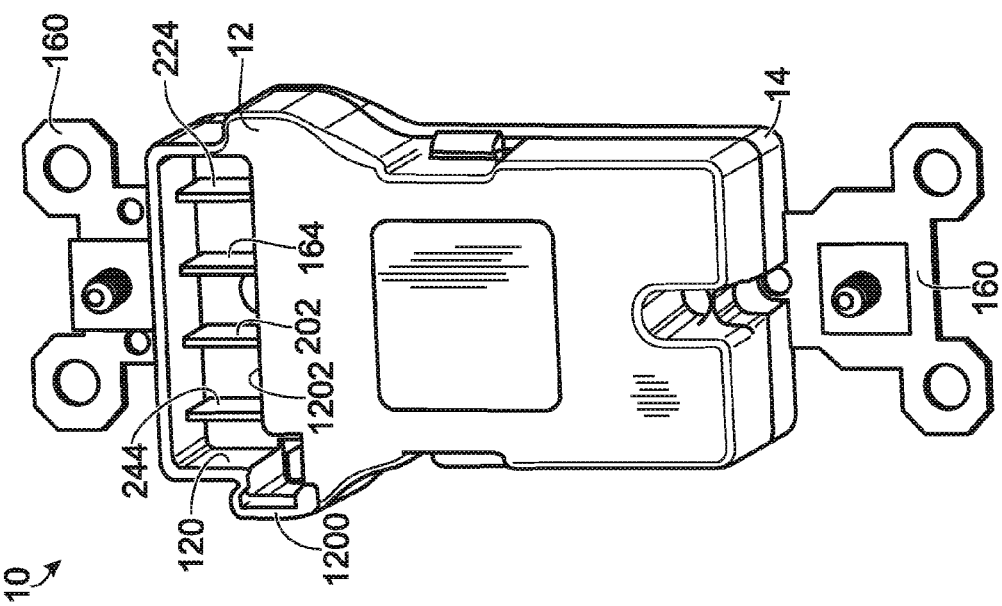
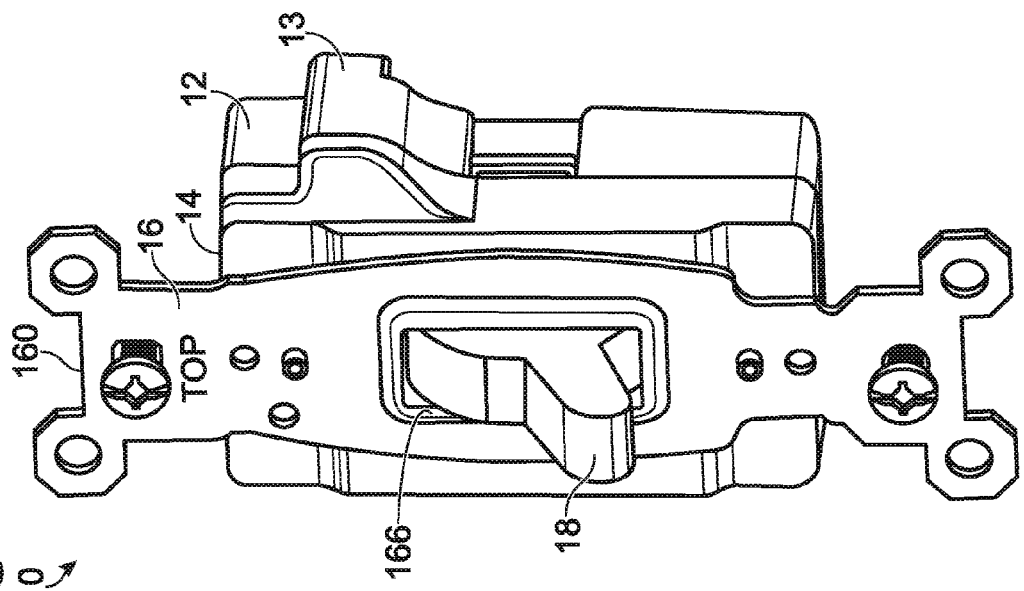

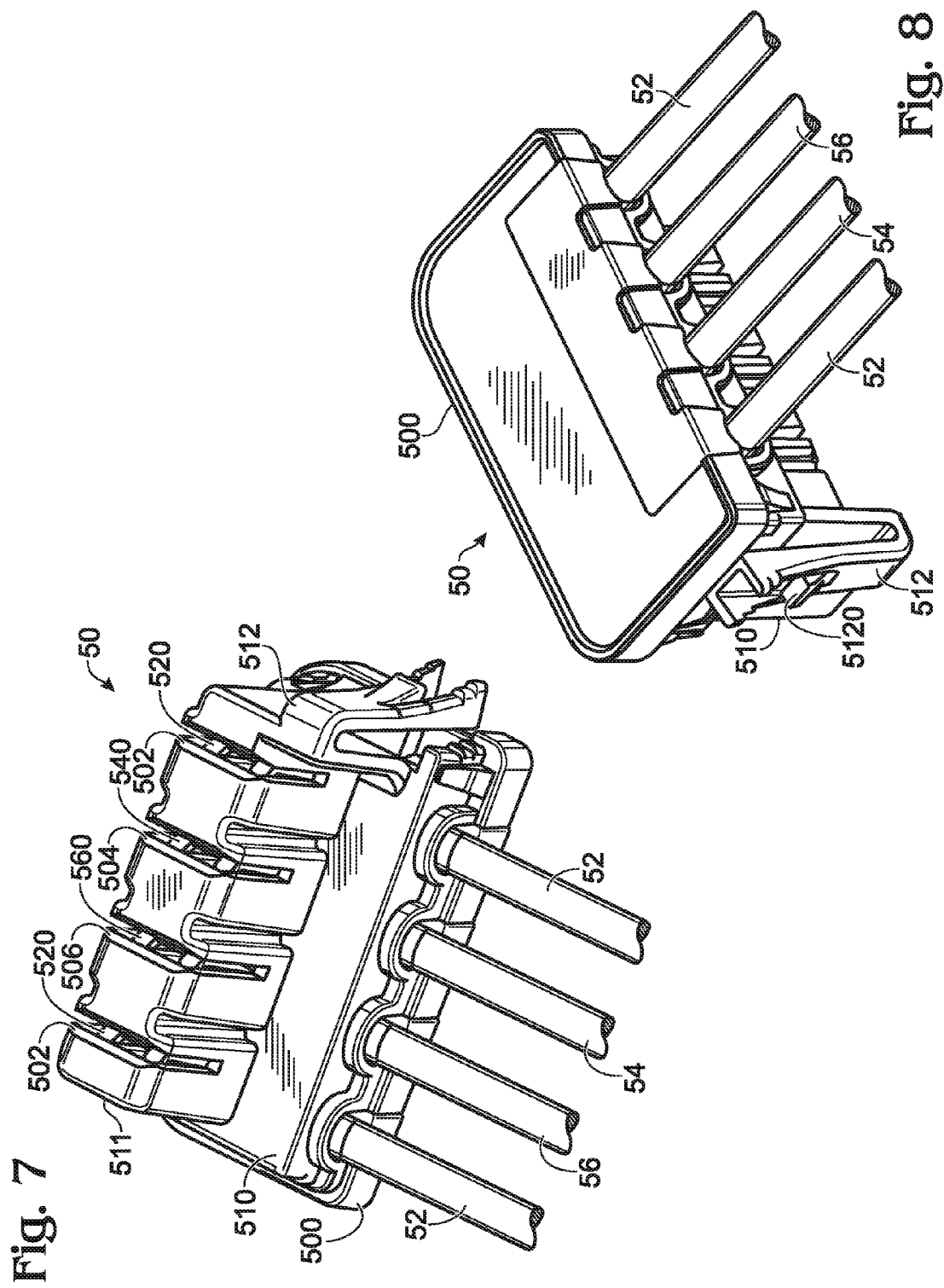

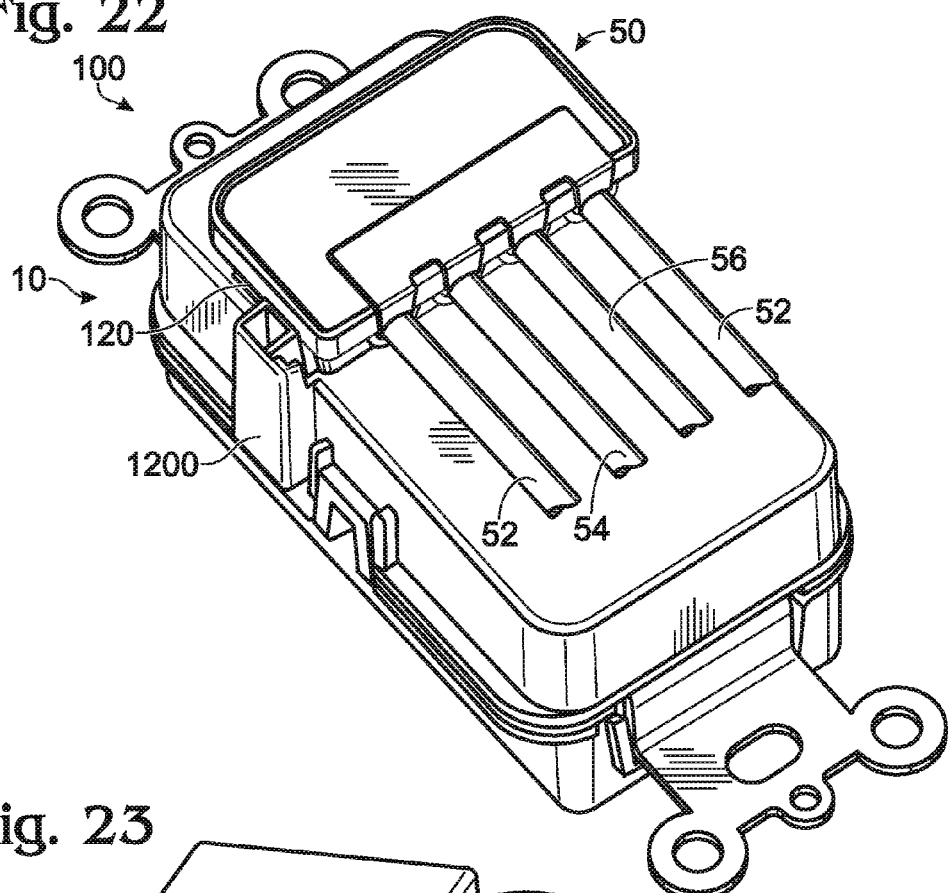
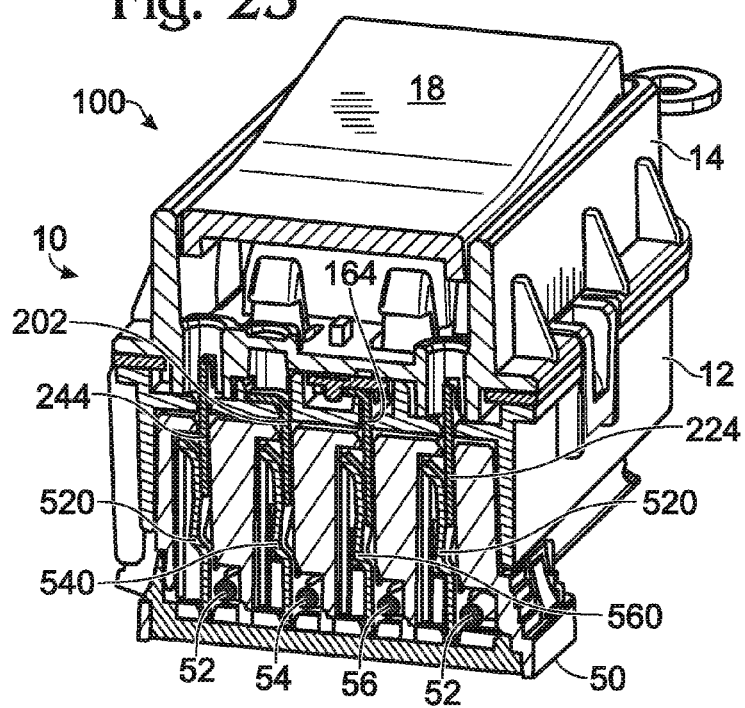
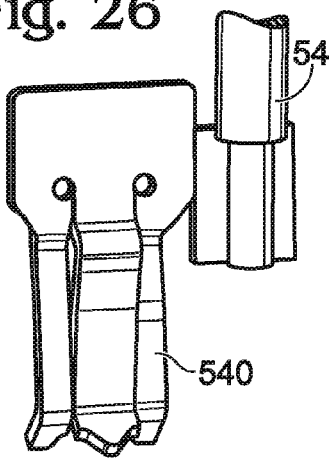

PLUG TAIL LIGHTING SWITCH AND CONTROL SYSTEM

CROSS-REFERENCE TO RELATED APPLICATIONS

This is a continuation-in-part of U.S. patent application Ser. No. 11/531,812 filed on Sep. 14, 2006, which is a continuation-in-part application of U.S. patent application Ser. No. 11/274,817 filed on Nov. 15, 2005 and U.S. patent application Ser. No. 11/032,420 filed on Jan. 10, 2005, both of which are continuation applications of U.S. patent application Ser. No. 10/680,797 filed on Oct. 7, 2003, the contents of which are relied upon and incorporated herein by reference in their entirety, and the benefit of priority under 35 U.S.C. §120 is hereby claimed.

BACKGROUND OF THE INVENTION

1. Field of the Invention

The present invention relates generally to electrical circuit installation, and particularly to electrical switching systems with features facilitating rapid and safe installation.

2. Technical Background

Installing electrical circuits in buildings and/or other structures is typically labor intensive, time-consuming, and a process that requires electricians of various skill levels. As a result the installation process is expensive. The first phase of the installation is commonly referred to as the "rough-in" phase. In new construction, either conduit or armored cable is disposed through out the structure in accordance with the building plans. Junction boxes are installed at appropriate locations, and brackets and metal device boxes are installed throughout the structure where electrical service is desired. Junction boxes, of course, are employed to house the connection point, or junction, of several conductors. Metal device boxes are used to accommodate electrical wiring devices. For example, the types of electrical wiring devices may include, but are not limited to, receptacles, switches, dimmers, GFCIs, AFCIs, transient voltage surge suppressors (TVSS), protective devices, timer devices, sensors of various types including occupancy sensors, thermostats, lighting fixtures, and/or combinations thereof. Wiring devices such as those listed that employ a switch are herein defined as switching devices. After the boxes are placed, the electrical wires are pulled through the conduits and all of the circuits are bonded. At this point, the leads from the electrical wires extend from the boxes and are visible and accessible for the next phase of the installation process.

Before discussing the next phase of the process, it is noted that electrical cables may include two to five conductive wires. For example, in a structure that requires high power, the most common way of distributing that power is by employing the three-phase power system. As those of ordinary skill in the art recognize, five wires are employed. Three phase power includes three "hot" or "live" wires. Each of these wires transmits electrical power that is 120 degrees out of phase with the other two hot wires. The other two wires are the neutral conductor and the ground wire. Three phase power typically comes from the power utility via four wires: the three-phase wires, and the neutral. If the current flowing through each of the phases is equal, no current will flow through the neutral. The neutral wire is typically connected to the building ground at the structure's main distribution panel. The five wire cable is distributed from the central panel. Some of the circuits in the structure are designed to provide power to grounded equipment. These circuits may employ three wires, a line conductor (hot wire), a neutral conductor, and a ground. Some circuits may only employ two wires, the line conductor and the neutral conductor.

Referring back to the installation process, after the "rough-in" phase has been completed, the electrical wiring devices are terminated, i.e., they are electrically connected to the wire leads. This part of the installation process is the most costly and time consuming. A journeyman electrician must perform, or supervise, the connection of each wiring device in the structure. In this process, each electrical wire must be stripped and terminated to the device.

What is needed is an efficient, labor-saving, and cost effective means for terminating the electrical wires and coupling them to the individual switching devices. Further, when the process involves the installation of electrical light switches, the electrical wiring and the light fixtures are in place before the switching devices are installed. Thus, the contractor cannot use the previously installed lighting and instead must rely on temporary lighting while the work proceeds. What is also needed, is a safe and reliable way of taking advantage of the installed electrical wiring and lighting even before the light switches themselves have been installed.

SUMMARY OF THE INVENTION

The present invention addresses the needs described above by providing an efficient, labor-saving, and cost effective means for terminating the electrical wires and coupling them to the individual switching devices. The present invention addresses the problems described above. The present invention is directed to an electrical wiring system that simplifies the installation process. Further, the present invention provides an efficient system and method for terminating electrical devices. The system and method is cost-effective because it eliminates many of the labor intensive practices that are currently in use. In addition, the present invention provides a safe and reliable way of taking advantage of the installed electrical wiring and lighting even before the light switches themselves have been installed.

One aspect of the present invention is directed to an electrical wiring system for use in an AC electrical power distribution circuit including at least one first AC power conductor disposed between an upstream AC power element and a device box and at least one second AC power conductor disposed between the device box and a downstream AC power element. The at least one first AC power conductor and the at least one second AC power conductor are routed into an interior portion of the device box and accessible via a front open face of the device box. The system includes a connector device including a connector housing having a plurality of connector contacts disposed therein. The plurality of connector contacts are coupled to termination structures configured to couple the at least one first AC power conductor and the at least one second AC power conductor to corresponding contacts of the plurality of connector contacts. An electrical wiring device includes a device housing having a front portion and a rear portion. The front portion includes at least one user-accessible control element disposed thereon. The at least one user-accessible control element is coupled to an electrical switch mechanism disposed in the device housing and coupled to a plurality of device contacts. The plurality of device contacts are accessible by way of a device connection arrangement formed in the rear portion of the device housing. The plurality of device contacts are configured to mate with the plurality of connector contacts when the connector device is coupled to the device connection arrangement.

In another aspect, the present invention includes an electrical wiring system for use in an AC electrical power distribution circuit including at least one first AC power conductor disposed between an upstream AC power element and a device box and at least one second AC power conductor disposed between the device box and a downstream AC power element. The at least one first AC power conductor and the at least one second AC power conductor are routed into an interior portion of the device box and accessible via a front open face of the device box. The system includes a connector device having a connector housing having a plurality of connector contacts disposed therein. The plurality of connector contacts are coupled to termination structures configured to couple the first plurality of AC power conductors and the second plurality of AC power conductors to corresponding contacts of the plurality of connector contacts. An electrical wiring device includes a device housing having a front portion and a rear portion. The front portion includes at least one user-accessible control element disposed thereon. The at least one user-accessible control element is coupled to an electrical circuit mechanism disposed in the device housing and coupled to a plurality of device contacts. The electrical circuit mechanism is configured to be switched between a first circuit state and a second circuit state. The plurality of device contacts are accessible by way of a device connection arrangement formed in the rear portion of the device housing. The plurality of device contacts are configured to mate with the plurality of connector contacts when the connector device is coupled to the device connection arrangement.

Additional features and advantages of the invention will be set forth in the detailed description which follows, and in part will be readily apparent to those skilled in the art from that description or recognized by practicing the invention as described herein, including the detailed description which follows, the claims, as well as the appended drawings.

It is to be understood that both the foregoing general description and the following detailed description are merely exemplary of the invention, and are intended to provide an overview or framework for understanding the nature and character of the invention as it is claimed. The accompanying drawings are included to provide a further understanding of the invention, and are incorporated in and constitute a part of this specification. The drawings illustrate various embodiments of the invention, and together with the description serve to explain the principles and operation of the invention.

BRIEF DESCRIPTION OF THE DRAWINGS

FIG. 2 is a perspective view of a toggle switch device in accordance with an embodiment of the present invention;

FIG. 3 is a perspective view of a back portion of the toggle switch device shown in FIG. 2;

FIG. 7 is a perspective view of a front portion of the connector device shown in FIG. 6;

FIG. 8 is a perspective view of a back portion of the connector device depicted in FIG. 7;

FIG. 22 is a perspective view of an electrical wiring system of the present invention featuring the rocker switch depicted in FIG. 18;

FIG. 23 is a latitudinal cross-section of the system depicted in FIG. 22 at a first end thereof;

FIG. 26 is perspective view of a plug device contact for the plug device depicted in FIG. 12.

DETAILED DESCRIPTION

Figure 1A:
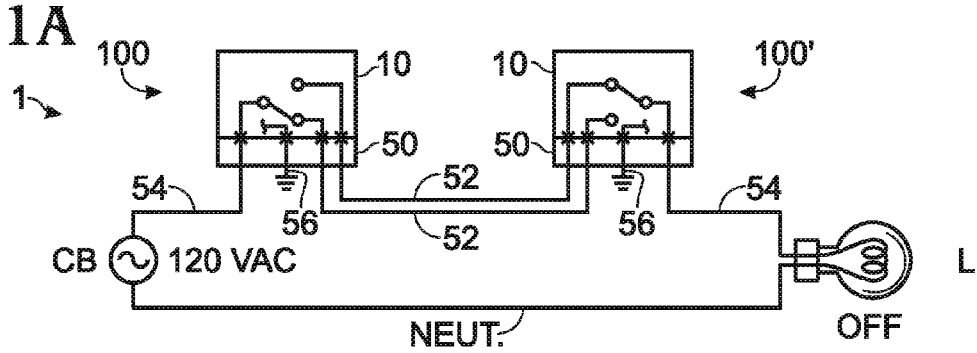
FIGS. 1A-1D are schematic diagrams of the present invention.

Reference will now be made in detail to the present exemplary embodiments of the invention, examples of which are illustrated in the accompanying drawings. Wherever possible, the same reference numbers will be used throughout the drawings to refer to the same or like parts. An exemplary embodiment of the system of the present invention is shown in FIG. 1, and is designated generally throughout by reference numeral 100.

The present invention is directed to an electrical wiring system for use in an AC electrical power distribution circuit that includes one or more AC power conductors disposed between an upstream AC power element and a device box and one or more AC power conductors disposed between the device box and a downstream AC power element. The "upstream" AC power conductors and the "downstream" AC power conductors are routed into an interior portion of the device box and accessible via a front open face of the device box. The upstream AC power element referred to above may be the circuit breaker panel, an AC distribution point, an electrical wiring device or another electrical wiring system of the type described herein. The downstream AC power element may be an electrical load, an electrical wiring device or another electrical wiring system of the type described previously.

The electrical wiring system 100 of the present invention includes a connector device 50 that has a connector housing having a plurality of connector contacts disposed therein. The plurality of connector contacts are coupled to termination structures configured to couple the one or more upstream AC power conductors and the one or more downstream AC power conductors to corresponding contacts of the plurality of connector contacts. The system 100 also includes an electrical wiring device 10 that has a device housing having a front portion and a rear portion. The front portion includes at least one user-accessible control element disposed thereon. The user-accessible control element is coupled to an electrical switch mechanism disposed in the device housing and coupled to a plurality of device contacts.

The plurality of device contacts are accessible by way of a device connection arrangement formed in the rear portion of the device housing. The plurality of device contacts are configured to mate with the plurality of connector contacts when the connector device is coupled to the device connection arrangement.

Accordingly, the present invention may be employed in a number of different ways and configurations. For example, the electrical wiring system of the present invention may be used to implement single pole single throw switch systems, single pole double throw (three-way) switch systems, four way switch systems, electrical wiring systems (such as duplex outlets or GFCIs) having feed-through capabilities. Feed-through, of course, refers to the ability to connect a device or system between line conductors (hot and neutral) and load conductors (hot and neutral).

Referring to FIGS. 1A-1D, schematic diagrams in accordance with one exemplary embodiment of the present invention are disclosed. In this example embodiment, the present invention is used to realize a three-way switch 100 that may be employed in an AC branch circuit 1 to control a light from two (or more) locations.

Figure 1B:
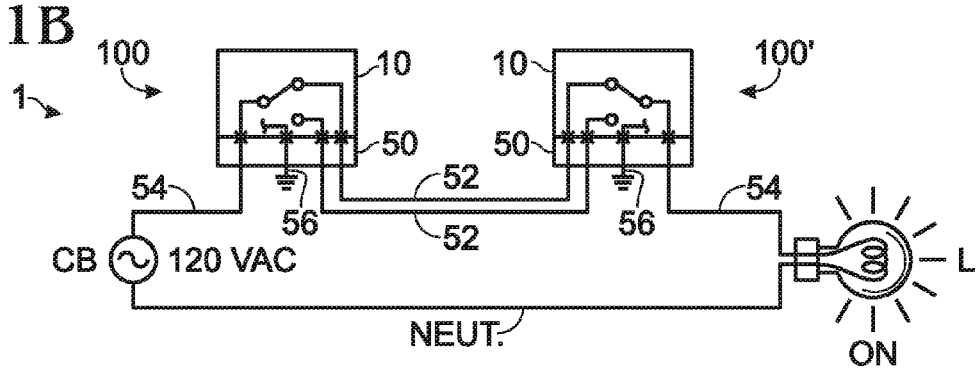
Figure 1C:
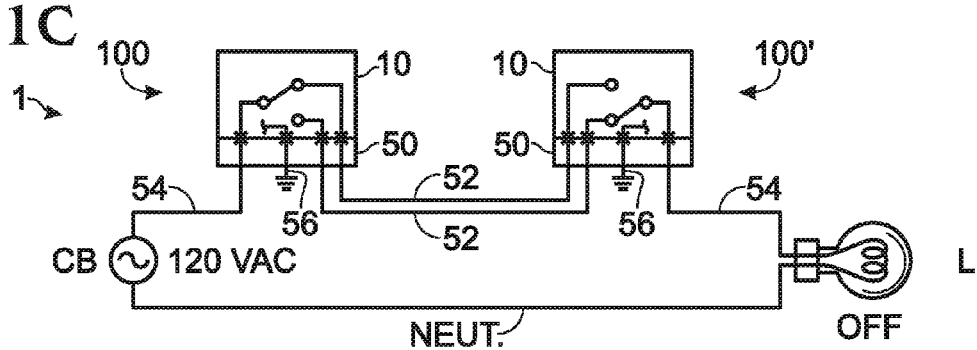
Figure 1D:
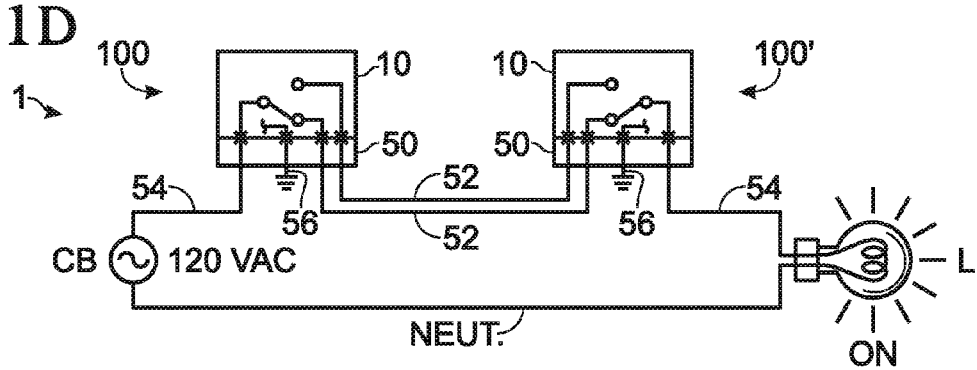

A first system 100 is connected to an upstream circuit breaker CB by way of common conductor 54. A ground conductor 56 is show schematically; in practice, it is typically connected to the ground strap in device 10 via the connector device 50. The first system 100 is also connected to two traveler conductors 52 which extend between the first system 100 and the second system 100'. The second system 100' is connected to load L via common conductor 54. The load L is, of course, connected to a neutral conductor that extends back to the circuit breaker CB to complete the circuit. In FIG. 1A, the switch systems 100 and 100' are positioned such that the light L is OFF. In FIG. 1B, switch system 100 is actuated at its location to provide power to light L to turn it ON. In FIG. 1C, switch system 100' is actuated to turn the light OFF. Finally, FIG. 1D shows system 100 being switched to its original position in FIG. 1A, to turn the light L back ON.

As embodied herein, and depicted in FIG. 2, a perspective view of a toggle switch device 10 in accordance with an embodiment of the present invention is disclosed. This embodiment is directed to a three-way switch that may be employed in the scenario provided above with respect to FIGS. 1A-1D. Toggle switch 10 includes a back body member 12 that is connected to a front cover portion 14, that collectively forms the device housing. A ground strap 16 is disposed over the front cover 16. The ground strap 16 includes mounting ears 160 on either end thereof, and a central aperture 166 that accommodates toggle switch mechanism 18. The switch housing is formed to include a winged portion 13 that accommodates various parts of the switch device 10. The winged portion 13, of course, may be eliminated by making the wiring device 10 wider.

Referring to FIG. 3, a perspective view of a back portion of the toggle switch device 10 shown in FIG. 2 is disclosed. The back body 12 includes a device connection arrangement 120 formed at one end thereof. In this example, the device connection arrangement is implemented as a rear receptacle 120 that provides access to the device contacts (164, 202, 224, 244) which are recessed within the receptacle 120. The receptacle 120 also includes a female latching mechanism 1200 formed in one side thereof. The latching mechanism 1200 receives a corresponding male latch member 512 disposed on the connector device (See FIG. 12, for example). In another embodiment of the present invention, the connection arrangement includes various ribbed features formed in the back body 12 in the shape of connector device 50. The device contacts extend from the back of device 10 in this embodiment (not shown).

It should be noted that the receptacle 120 is disposed at one end of the device to ensure that the overall thickness of the wiring device 10 is as small as possible. The device contacts (164, 202, 224, 244) are separated within receptacle 120 from the switch mechanism by a non-conductive barrier 1202. Of course, it is entirely feasible to position the receptacle 120 in a center portion of the device by increasing the thickness of the back body.

Figure 4:
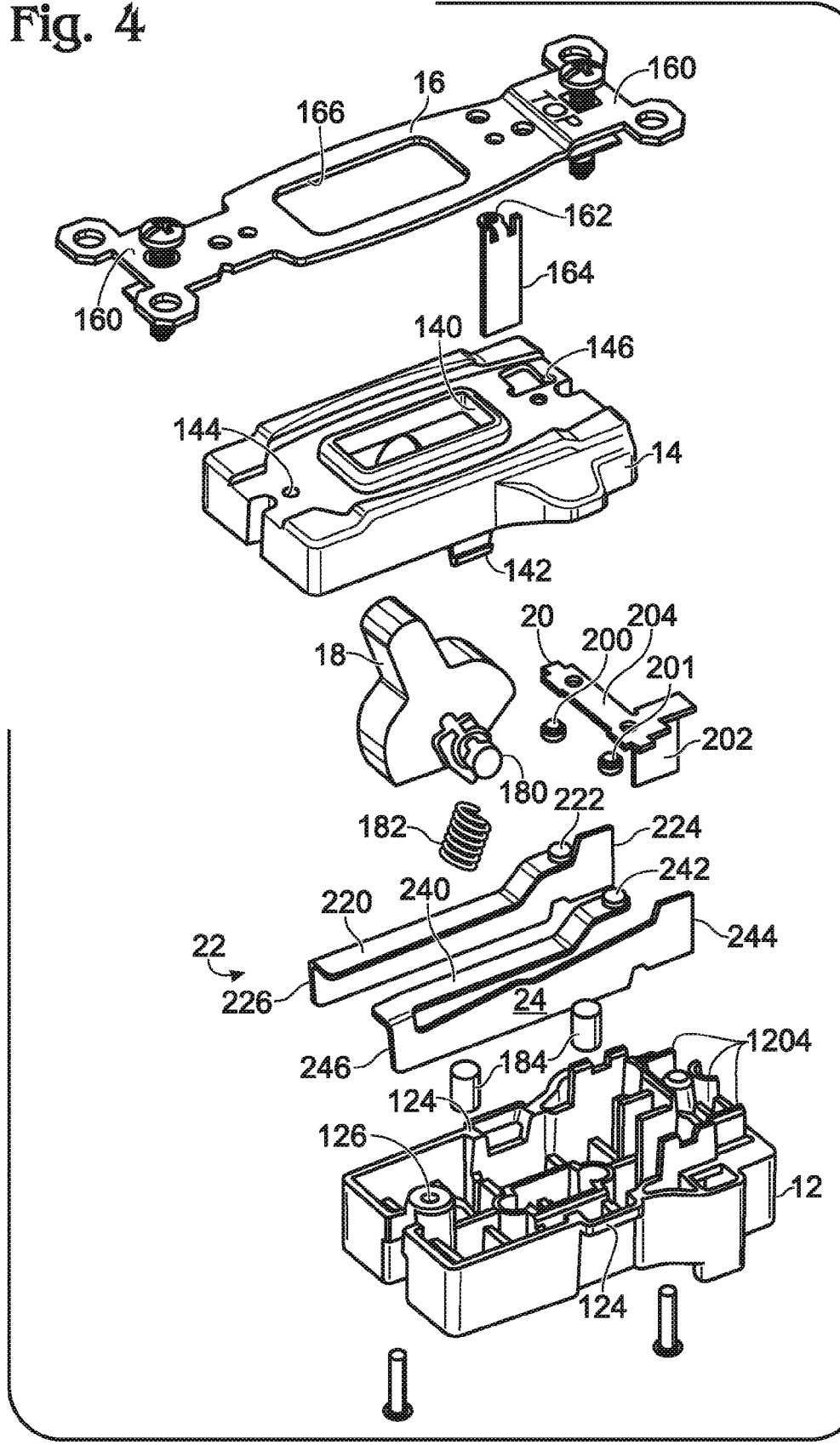
FIG. 4 is an exploded view of the toggle switch device depicted in FIG. 2.

Referring to FIG. 4, an exploded view of the toggle switch device depicted in FIG. 2 is disclosed. The front cover 14 includes a central aperture 140 that accommodates toggle switch actuator 18. A second aperture 146 provides the device ground contact 164 with an egress point into the interior of the housing. Of course, device ground contact 164 is ultimately positioned within the rear receptacle 120 (FIG. 3). The device ground contact is connected to the ground strap 16 by tab 162, which is fastened thereto.

The electrical switch mechanism includes stationary common structure 20, traveler structure 22 and traveler structure 24. The common member 20 includes two fixed contacts 200, 201 disposed on a stationary bridge 204. The stationary bridge 204 is connected to the device common contact 202 which is disposed within the rear receptacle 120 (See FIG. 3). Traveler member 22 includes a stationary side-rail 226 that is connected to a flex arm 220 at one end and a device traveler contact 224 at the other end thereof. The flex arm 220 includes a movable contact 222 disposed at the free cantilevered end of the flex arm 220. The movable contact 222, of course, is aligned with fixed contact 200. This contact pair (200, 222) is opened or closed in accordance with the position of the toggle switch actuator 18. The traveler structure 24 is a mirror image of structure 22. Therefore, no further explanation is required other than to say that movable contact 242 and fixed contact 201 form the second switch pair.

The toggle actuator 18 includes a cammed portion 180 that ensures that only one contact pair (200, 222 or 201, 242) is closed at a time. When the actuator 18 is at the limit of rotation in one direction, the movable contact 222 on traveler 22 mates with stationary contact 200 on the common member 20. When the toggle actuator 18 is at the opposite limit of rotation, the cam 180 on the other side of the actuator 18 causes the movable contact 242 on traveler 24 to mate with stationary contact 201 on the common member 20. Because the cams 180 are staggered relative to each other, only one of the flex arm contacts is connected to the common member at any one time.

Finally, please note that the spring 182 disposed under the toggle actuator 18 causes it to "snap" between into position toward one end of device 10 or the other.

Note that in the embodiment depicted in FIG. 4, the side-rail is longer than the flex arm. This provides spatial separation between receptacle 120 and the electrical switch mechanism. The device traveler contacts (224, 244) are implemented by blade structures integrally formed at the extended ends of the travelers. The device common contact 202 and the device ground contact 164 are also implemented as blade structures. When the switch 10 is fully assembled, the blades (164, 202, 224, 244) are positioned in the rear receptacle 120 to mate with the connector contacts disposed in the connector device 50. The back body 12 includes plastic walls 1204 that isolate the device contacts (164, 202, 224, 244) from each other.

One purpose of the rear receptacle 120 is to shelter the blade terminals when the connector device 50 is being inserted. One feature of the present invention is that, unlike devices that feature screw terminals, connector device 50 may be mated with the device contacts in receptacle 120 when the conductors terminated by connection device 50 are electrically live.

Figure 5:
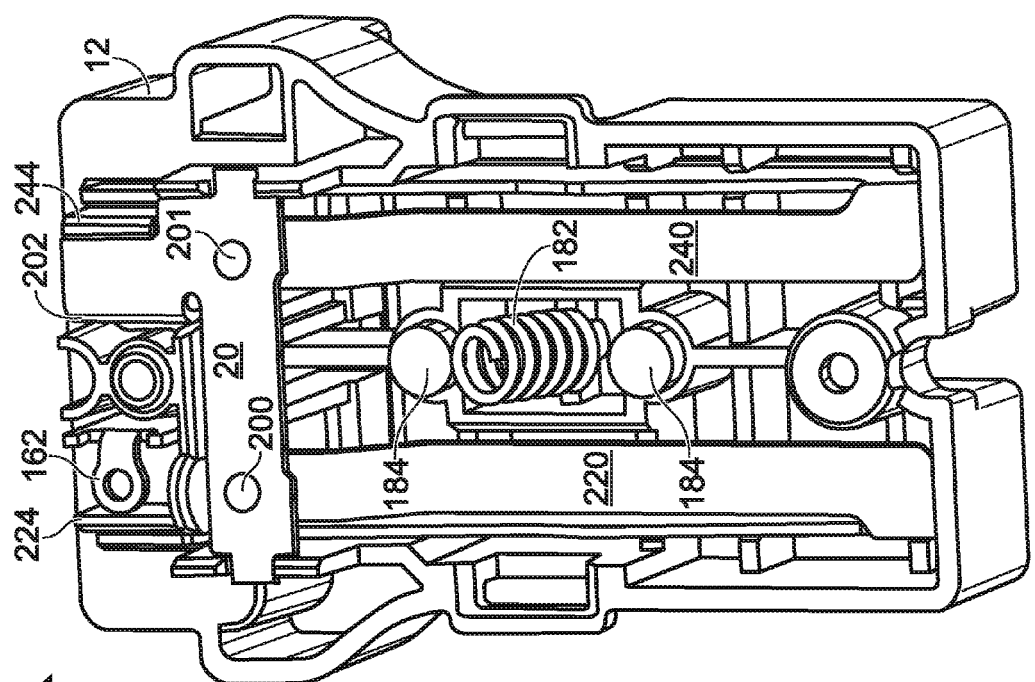
FIG. 5 is a perspective view of the toggle switch device shown in FIG. 2 with the front cover removed.

FIG. 5 is a perspective view of the toggle switch device shown in FIG. 2 with the front cover 14 and toggle switch 18 removed. Referring to the top of the page, the device contacts are arranged within receptacle 120 in the order of device traveler contact 224, device ground contact 162, common contact 202, and device traveler contact 244. Flex arms 220 and 240 are cantilevered leaf springs that are naturally biased upward such that contacts 222 and 242 are engaged with contacts 200 and 201 respectively. The toggle switch 18 position (in this view) is either up or down, such that only one contact pair is closed at a time in the manner previously described. Actuator spring 182 is coupled between actuator 18 and a raised portion of the interior wall of back body 12. Spring 182 is shown as being disposed between pad elements 184. When the toggle switch actuator 18 is snapped into position by spring 182, the pads 184 on either side absorb the energy and prolong the life of the toggle switch actuator 18.

Figure 6:
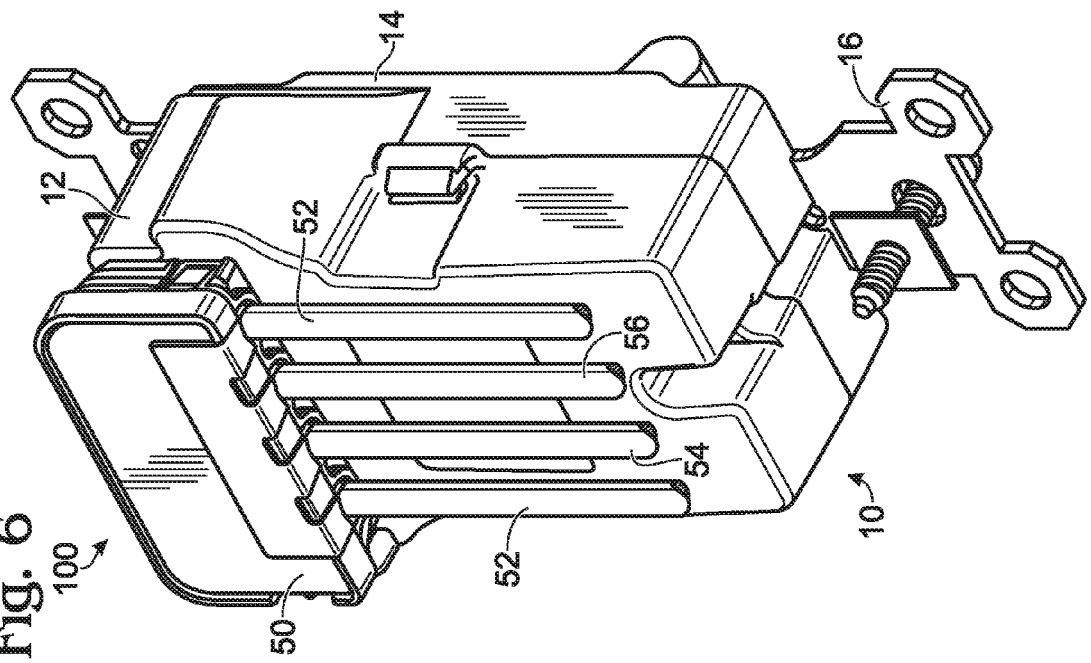
FIG. 6 is a perspective view of an electrical wiring system of the present invention featuring the toggle switch depicted in FIG. 2.

Referring to FIG. 6, a perspective view of an electrical wiring system 100 of the present invention is disclosed. As shown, the connector device 50 is fully inserted into the rear receptacle 120. The connector device 50 terminates AC power wires from the AC branch circuit. This embodiment is fully consistent with the example provided in FIG. 1. Connector device 50 terminates two traveler conductors 52, common conductor 54 and ground conductor 56.

FIG. 7 is a perspective view of a rear portion of the connector device 50 shown in FIG. 6. Connector device 50 includes a front cover 500 which is mated to a back body 510. The back body 510 includes a contact housing portion 511 which, as its name indicates, houses the connector contacts. The contact housing portion 511 includes access slots (502, 504, 506, 502) which provide access to connector traveler contact 520, connector common contact 540, connector ground contact 560, and the second connector traveler contact 520, respectively. A flexible male latch member 512 is integrally formed into the housing portion 511 and mates with the female latch mechanism 1200 in device receptacle 120 (FIG. 3).

FIG. 8 is a perspective view of a front portion of the plug device depicted in FIG. 6. In this view, the front cover is a planar member which includes indicia that identifies each of the wires terminated by connector device 50. Note that flexible latch member includes a latching tab 5120 that is configured to prevent connector 50 from being pulled out of the receptacle 120. The flexible latch mechanism 512 may be depressed by a user with only one hand when removing the connector 50 from the device 10. Had the flexible part of the mechanism been located on the wiring device, two hands would have been required to disengage the latch. Note also that the latch mechanism 512 is located away from the contacts on the back of the connector, and therefore, do not interfere with the blade openings. The latching mechanism (1200, 512) is configured to withstand a 20 pound pulling force applied for a predetermined period of time such as a minute.

Figure 9:
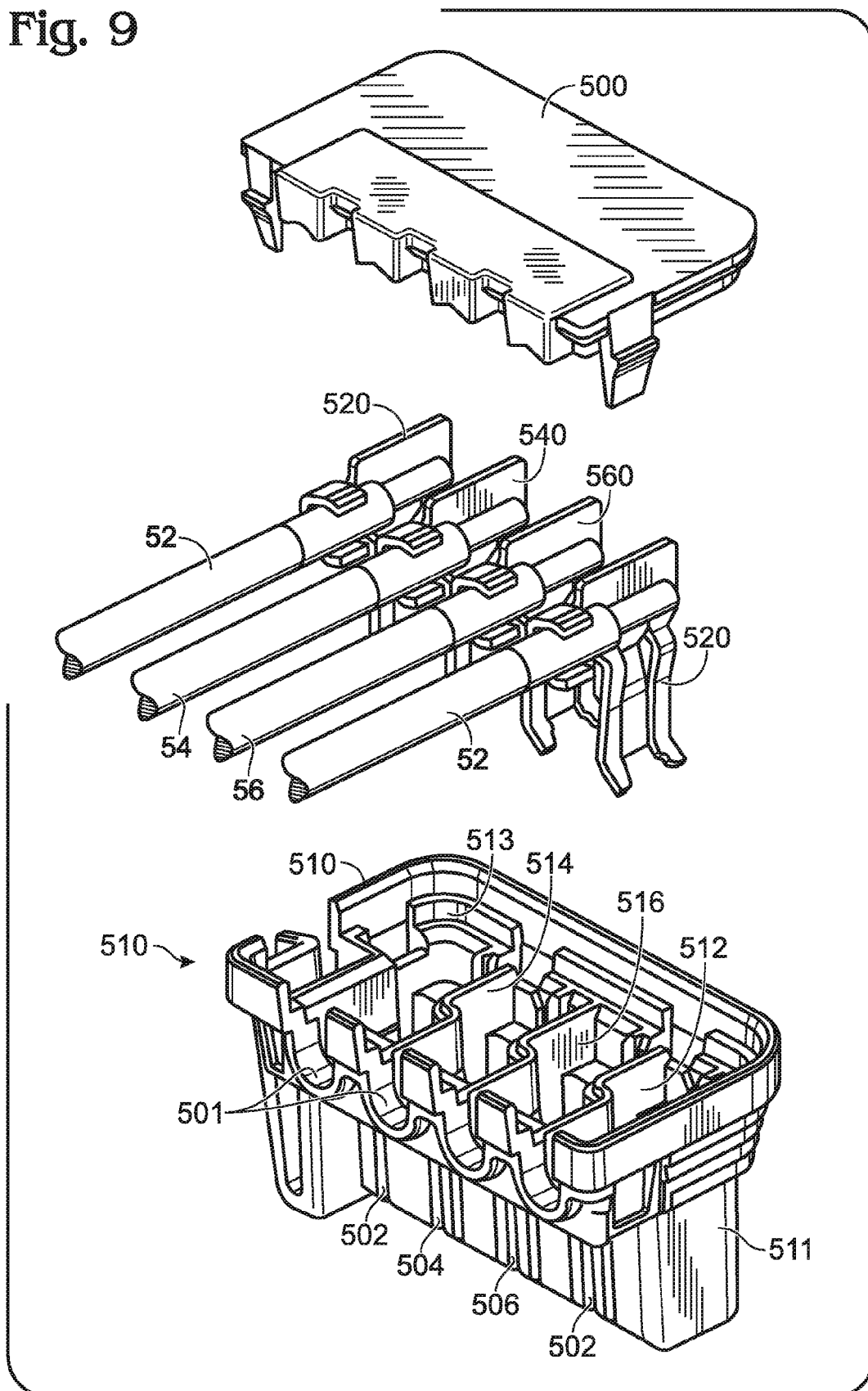
FIG. 9 is an exploded view of the connector device depicted in FIG. 7.

Referring to FIG. 9, an exploded view of a the connector device 50 depicted in FIG. 7 is shown. Back body 510 includes wiring egress ports 501 that are configured to accommodate the conductors (502, 504, 506, 502). The contact housing portion 511 of the back body 510 is divided into four electrically insulated compartments. A compartment 513 is disposed at either end and they accommodate connector traveler contacts 502, which are shown as terminating traveler wires 52. Internal common compartment 514 accommodates connector common contact 540, which terminates common conductor 54. Finally, ground compartment 516 accommodates connector ground contact 560, which terminates ground conductor 56. This design ensures that the connector contacts are substantially in parallel with each other and easily mate with the plurality of device contacts disposed in receptacle 120. Once the contacts are snapped into their respective compartments, the cover member 500 is snapped in place to complete the assembly.

Note that connector device 50 is configured as a "right angled connector." The term right angle refers to the fact that the conductors and the contacts form a right angle relative to each other. One advantage of the right angle connector device 50 is that when the connector is inserted into receptacle 120 as shown in FIG. 6, the distance from the rear surface of the ground strap 16 to the front cover 500 is less than 1.375 inches. While the right angle plug is considered desirable in certain circumstances, the present invention may be employed with a straight connector device (See FIG. 27).

Figure 10:
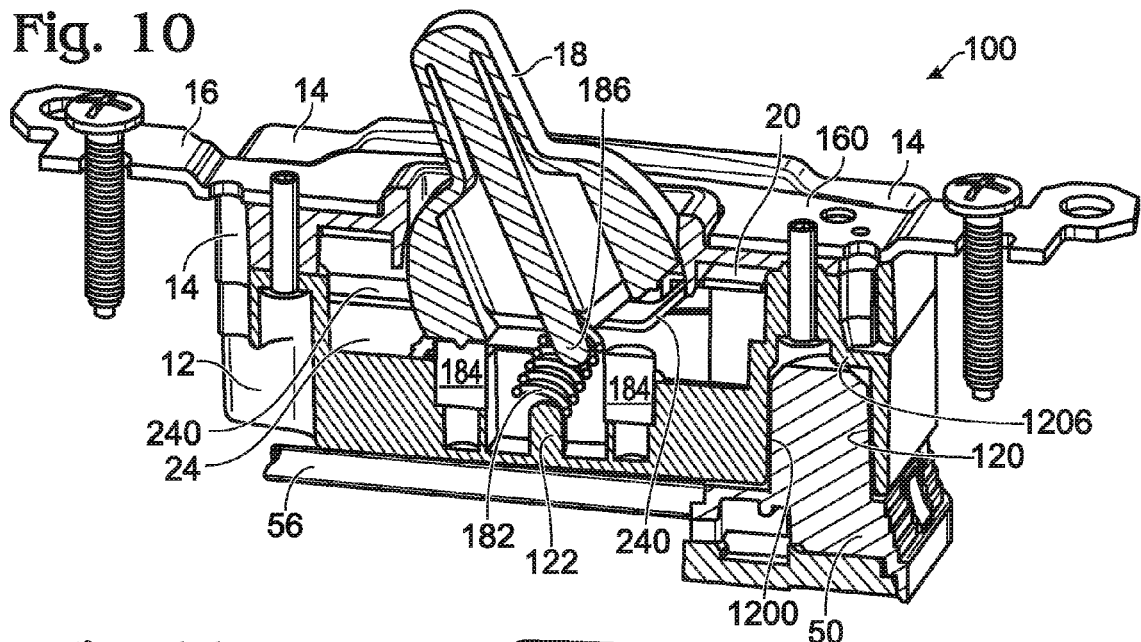
FIG. 10 is a longitudinal cross-section of the system depicted in FIG. 6.

Referring to FIG. 10, a longitudinal cross-section of the system 100 depicted in FIG. 6 is shown. The connector device 50 is fully inserted and latched into receptacle 120. The "nose" of the connector 50 does not abut the strap 16. Receptacle floor 1206 is disposed between the strap 16 and the device contact blades to prevent the blades from shorting out to the strap. In an alternate embodiment, the floor 1206 may be omitted if the strap has one or two side rails instead of being straight-through. The view provided by FIG. 10 clearly shows spring 182 being disposed between toggle actuator tab 186 and back body element 122. Traveler member 24 as well as its flex arm 240 are clearly shown behind toggle switch actuator 18.

Figure 11:
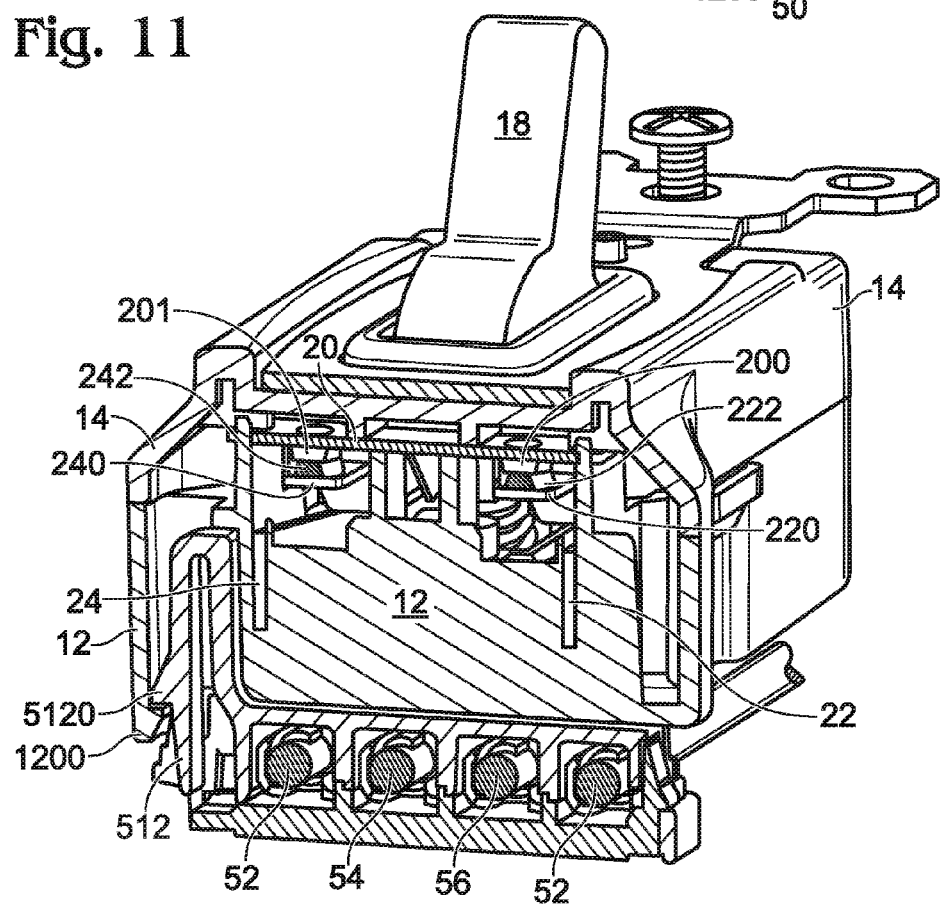
FIG. 11 is a latitudinal cross-section of the system depicted in FIG. 6 at an intermediate portion thereof.

Referring to FIG. 11, a latitudinal cross-section of the system 100 depicted in FIG. 6 at an intermediate portion of device 10 where the wires (52, 54, 56, 52) enter connector 50. In this toggle switch position, the fixed contact 200 and movable contact 222 are closed and fixed contact 201 and movable contact 242 are open. This view also shows the operation of the latching mechanism quite clearly. Latching tab 5120 disposed on flexible latch member 512 is engaged by a lip formed in the female latch member 1200.

Figure 12:
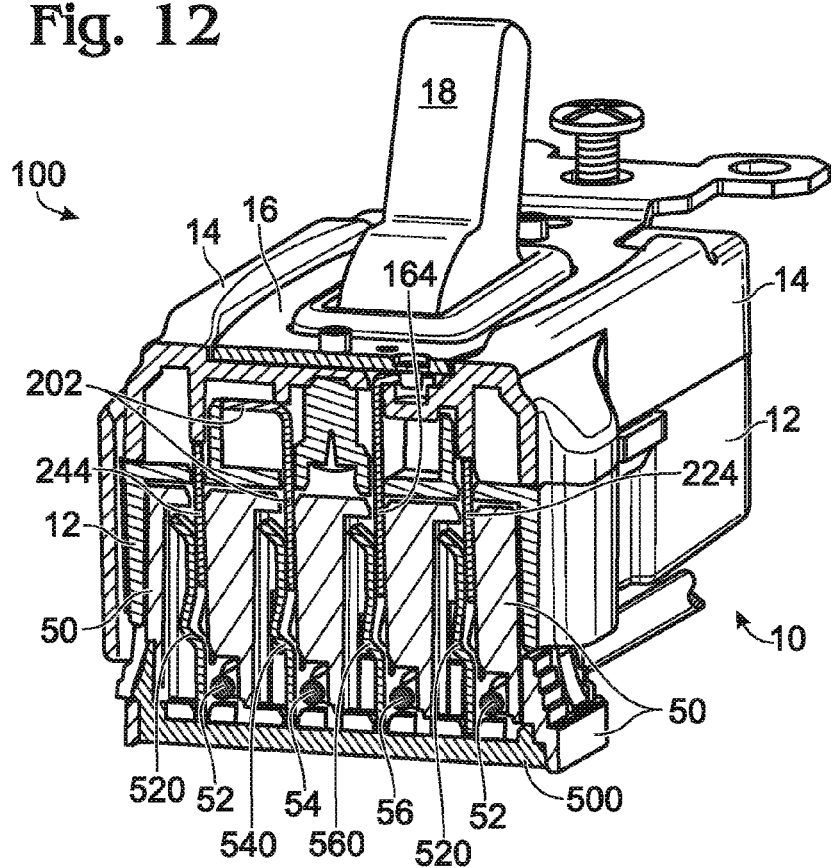
FIG. 12 is a latitudinal cross-section of the system depicted in FIG. 6 at an end thereof.

FIG. 12 is a latitudinal cross-section of the system depicted in FIG. 6 at an end of the device 10. From left to right, the traveler device contact 244 extends downwardly from the floor of the receptacle 120 and is engaged by the traveler connector contact 520 coupled to traveler wire 52. Device common contact 202 extends from the stationary common member 20 into the receptacle 120 and is engaged by common connector contact 540, which in turn, is connected to common wire 54. Device ground contact 164 extends from the ground strap 16 and is engaged by connector ground contact 560. Of course, the connector ground contact 560 is connected to ground wire 56. Finally, at the right end of the drawing, the second device traveler contact 224 is engaged by the second connector traveler contact 520, which is connected to the second traveler wire 52.

Figure 13:
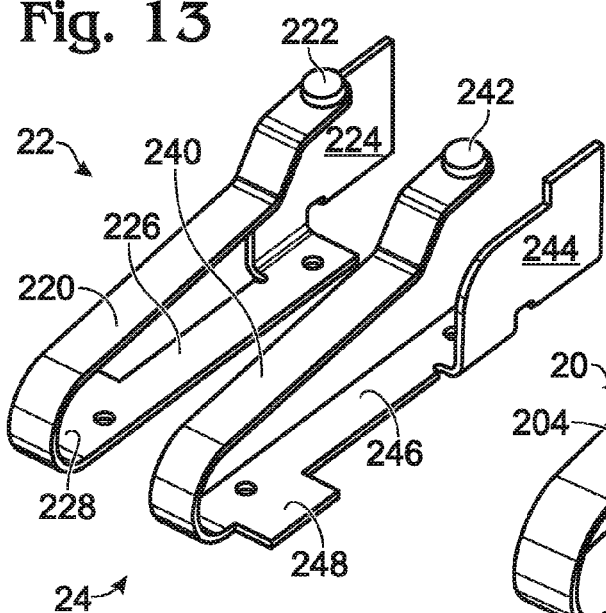
FIG. 13 is a perspective view of an alternative traveler contact structure.

Referring to FIG. 13, a perspective view of an alternative traveler contact structure in accordance with alternate embodiment of the present invention is disclosed. In this embodiment, the side rails of structure 22 and 24 previously disclosed are replaced by base portions 226 and 246, respectively. This structure may be advantageous during fabrication because it has fewer complex bends. Structures 22 and 24 may be fabricated by stamping out a single strip of conductive material having a winged device blade (224, 244) at one end and the flex arm (220, 240) at the other. Subsequently, the flex arm (220, 240) is folded over the rectangular portion (228, 248) in the manner depicted to complete the fabrication of the part.

Figure 14:
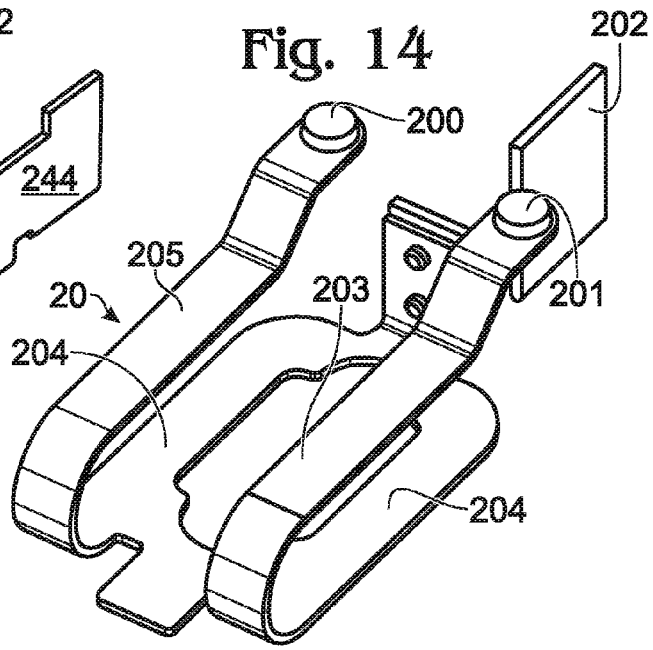
FIG. 14 is a perspective view of an alternative common member contact structure.

Referring to FIG. 14, a perspective view of an alternative common member contact structure 20 in accordance with yet another alternate embodiment of the present invention is disclosed. In this embodiment, the traveler contact structures (22, 24) are fixed within device 10. Common structure 20 includes a base portion 204 which is configured to be seated within the back body 12 of device 10. Flex arms (203, 205) extend from one end portion of base 204 and include movable contacts 201 and 200, respectively. A device common contact 202 extends from the other end of the base portion 204.

As previously noted, the present invention applies to other types of switches. In one embodiment, one of the traveler structures (22 or 24) is omitted to create a single-pole single-throw switch. In another embodiment, the switching structure may be configured as two single pole switches. The common member 20 is split into two members each having a single stationary contact. Each of the common members has a device contact disposed in receptacle 120. The two cams on the toggle actuator are aligned so the movable contacts open and close together, or by replacing the single toggle switch 18 with two switch actuators.

Figure 15:
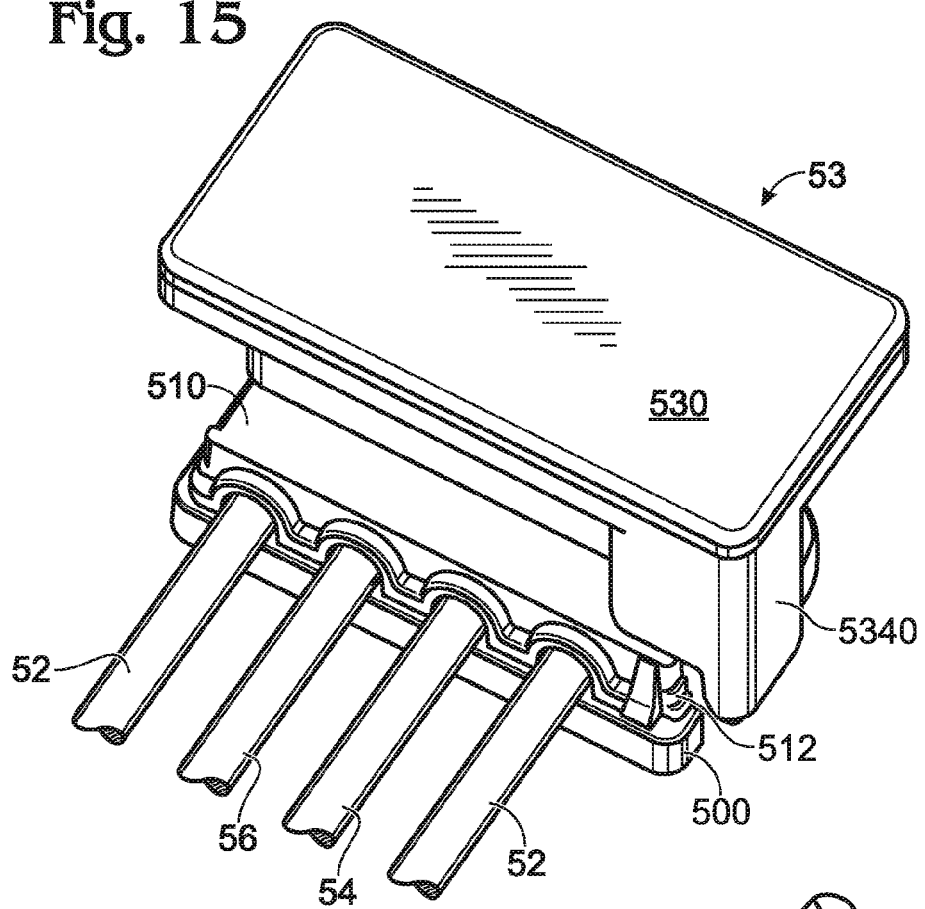
FIG. 15 is a perspective view of a pull switch device in accordance with another embodiment of the present invention.

As embodied herein and depicted in FIG. 15, a perspective view of a pull switch device 53 used in conjunction with connector device 50 is disclosed. A problem arises during the conventional rough-in phase of the installation after the connector 50 has terminated the AC branch wires (52, 54, 56, 52). While power may be available, it cannot be used because the switch device 10 has not been connected to the lighting device via connector 50 because other construction procedures such as sheet rocking, painting, etc. are being performed. Accordingly, when conventional devices are employed, the contractor must employ portable lighting fixtures during this phase at considerable expense. The pull switch 53 of the present invention remedies this issue by shorting together the two traveler contacts and the common contact. Viewed in conjunction with FIGS. 1A-1D, one of ordinary skill in the art will understand that shorting these contacts together in the connector device will permit the downstream load to be energized.

In FIG. 15, the pull switch 53 is plugged into the connector device 50. The pulls switch includes a front cover 530 and an insert body 534 (not shown) that includes a latch 5340 configured to engage connector latch mechanism 512 to secure the connection.

Figure 16:
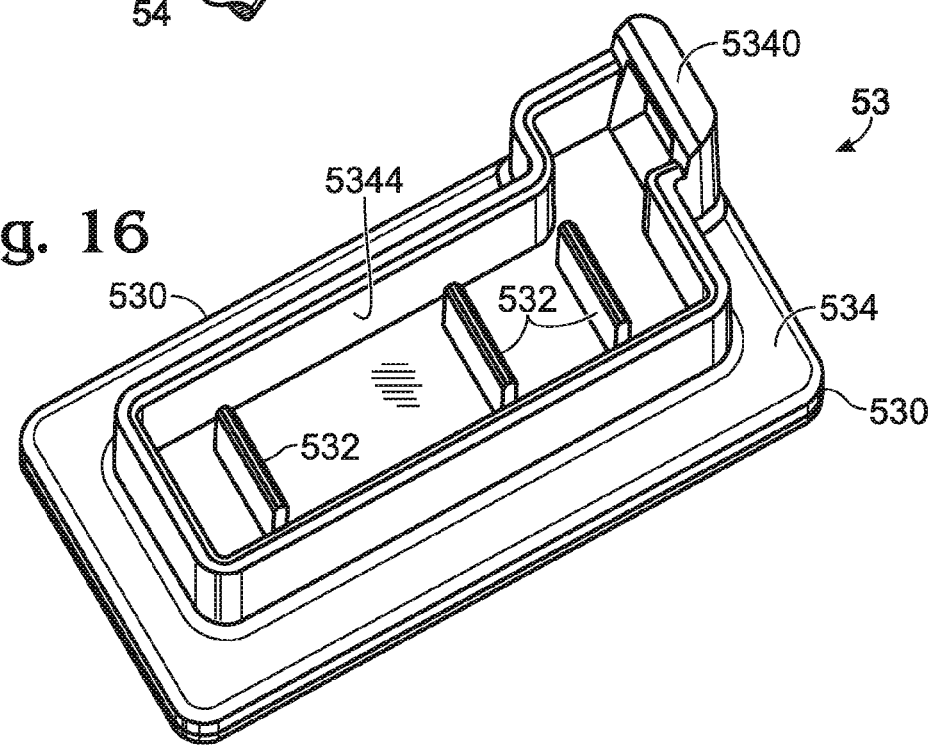
FIG. 16 is a perspective view of a rear portion of the pull switch depicted in FIG. 15.

FIG. 16 is a perspective view of a rear portion of the pull switch depicted in FIG. 15. In this view, internal contacts 532 are disposed within the lip portion 5344 of insert body 534. The internal view of latch member 5340 may also be seen. It includes a hollow lip that is configured to engage the flexible latch 512 of connector device 50.

Figure 17:
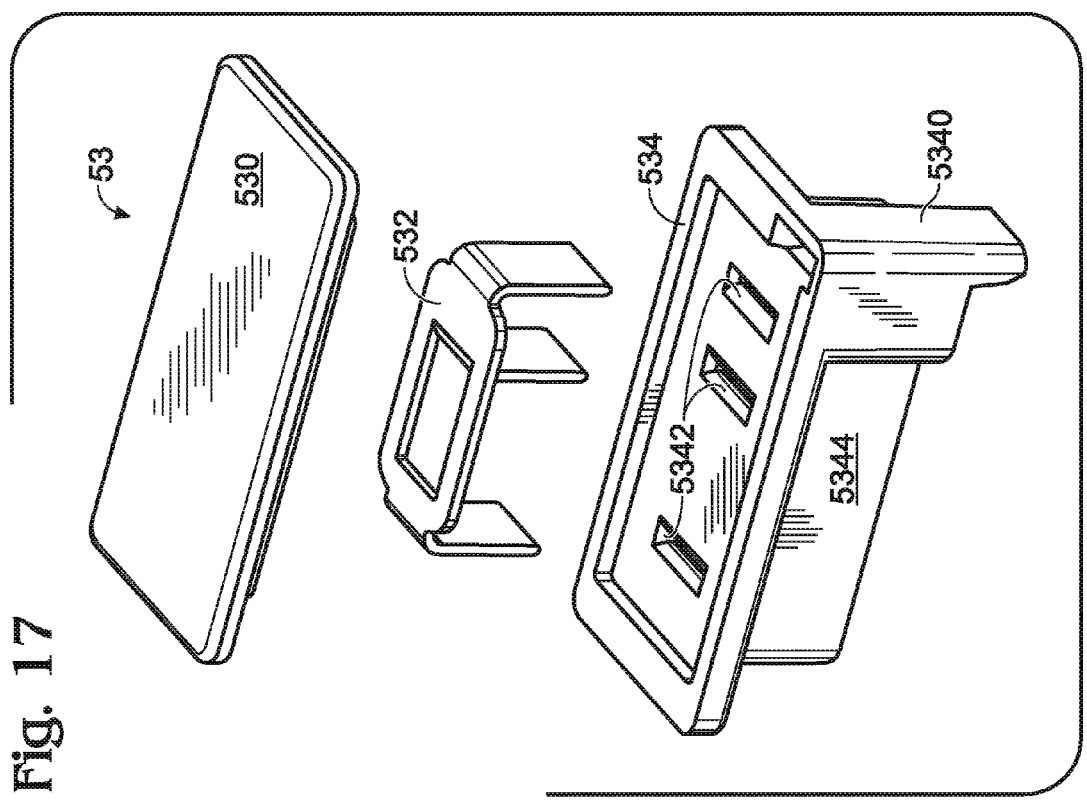
FIG. 17 is an exploded view of the pull switch depicted in FIG. 15.

FIG. 17 is an exploded view of the pull switch depicted in FIG. 15. The contact structure 532 is shown as an integral piece of conductive material that includes three contacts extending therefrom. The three contacts are inserted into the slots 5342 formed in insert member 534 such that they enclosed within lip member 5344. Finally, the cover portion 530 is snapped over insert 534 to complete the pull switch assembly.

Figure 18:
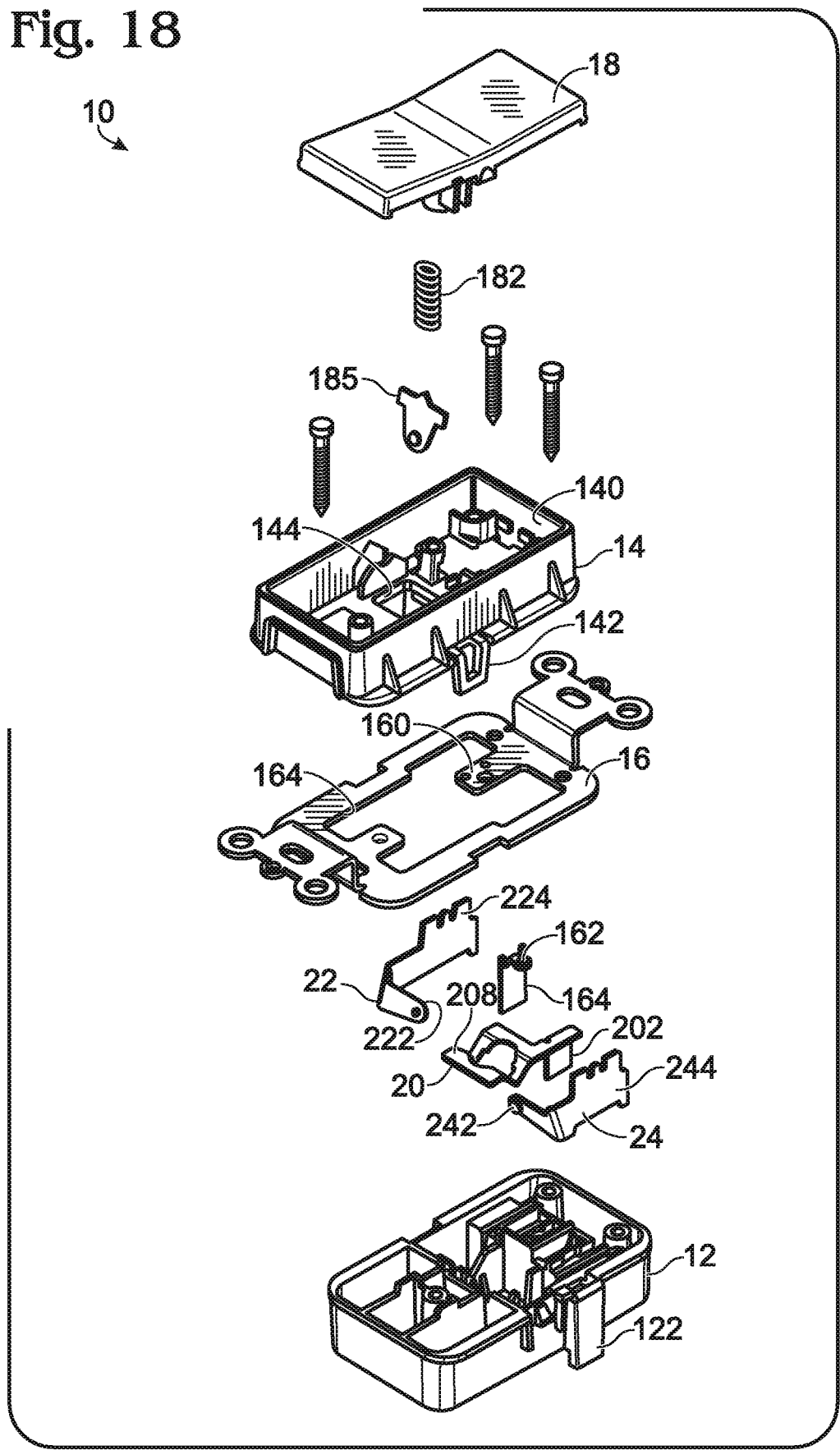
FIG. 18 is an exploded view of a rocker switch device in accordance with an alternate embodiment of the present invention.

As embodied herein and depicted in FIG. 18, an exploded view of a rocker switch device 10 in accordance with an alternate embodiment of the present invention is disclosed. Switch device 10 includes a decorator paddle switch 18 that is disposed within aperture 140 of the cover member 14. The paddle switch 18 is coupled to a spring element 182. The spring element 182 is connected to a pivot contact member 185 which is seated within the cradle portion of common contact structure 20. The pivot member 185 extends through an opening 144 in the cover member 14 and through the central opening 164 formed in ground strap 16.

The ground strap 16 further includes a tab member 160 which extends inwardly into opening 164. The device ground contact 162 extends from tab member 160 into receptacle 120.

Figure 19:
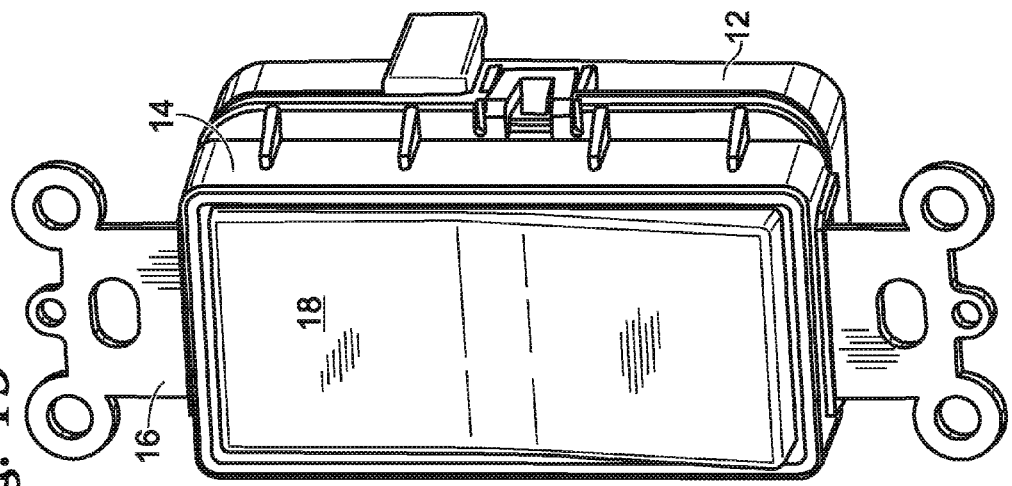
FIG. 19 is a perspective view of the rocker switch device depicted in FIG. 18.

The switch device 10 is configured as a three-way switch that includes traveler contact structure 22, common contact structure 20 and traveler contact structure 24. The common structure 20, as alluded to previously, includes an apertured cradle 208 which accommodates pivot contact 185. The common member also includes device common contact 202. Traveler contact structures 22 and 24 are disposed on either side of the common structure 20 and are mirror images of each other. Traveler structure 22 includes traveler contact 224 on one end thereof and a fixed contact 222 on the opposite end. The fixed contact 222 is disposed on the outboard side of the pivot member. The fixed contact 242 on traveler structure 24 is disposed on the inward side of the pivot contact 185. Of course, the pivot contact 185 is positioned by the paddle switch to engage either contact 222 or contact 242 by way of a double-sided contact FIG. 19 is a perspective view of the fully assembled rocker switch device 10 depicted in FIG. 18.

Figure 20:
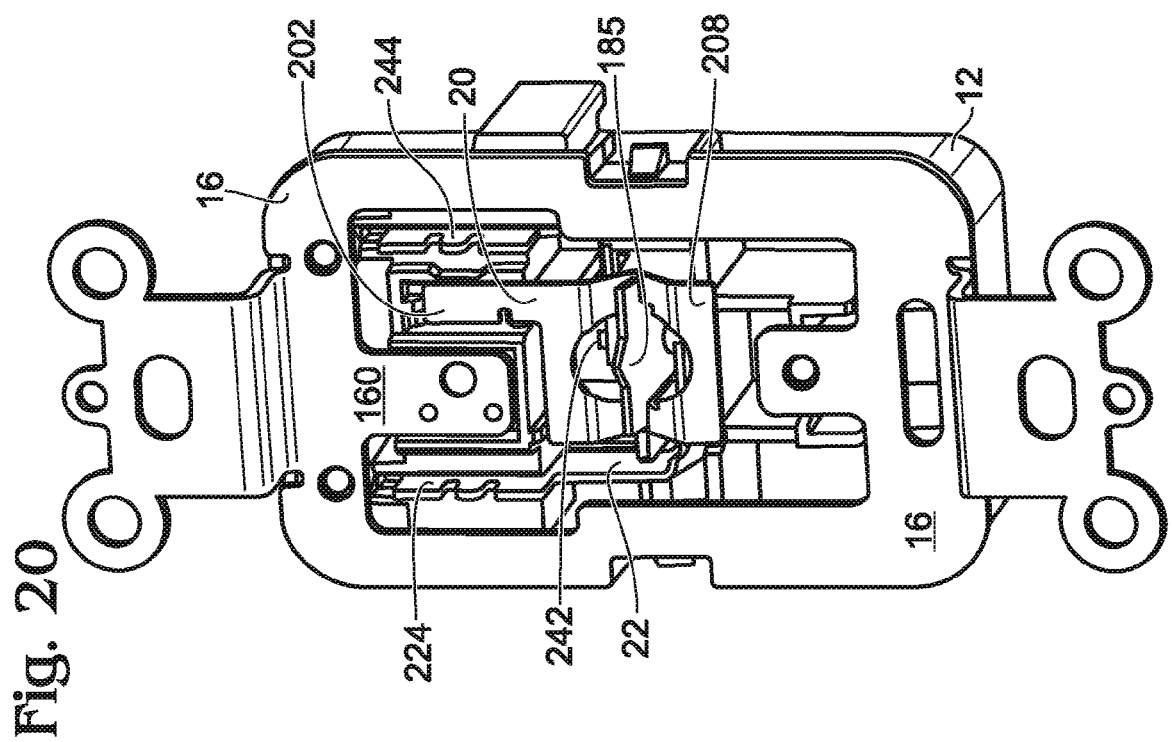
FIG. 20 is a perspective view of the rocker switch device depicted in FIG. 18 with the front cover portion removed.

Referring to FIG. 20, a perspective view of the rocker switch device 10 depicted in FIG. 18 is shown with the front cover portion 14 removed. In this view, the switch mechanism is framed by the central opening of the ground strap 16. Going from left to right and starting at the top left corner, the device contacts are aligned in a row within the receptacle 120 (disposed underneath device 10). Device traveler contact is leftmost, and disposed adjacent the ground contact 164 which is disposed underneath ground tab 160. The device common contact 202 is disposed between the ground contact 164 and the rightmost traveler contact 244. In the center of the device 10, the common contact structure 20 is shown with the pivot contact 185 disposed therein. The pivot contact is rotated in the upward direction to engage traveler contact 222 which is disposed under the common contact structure 20 and is therefore not visible.

Figure 21:
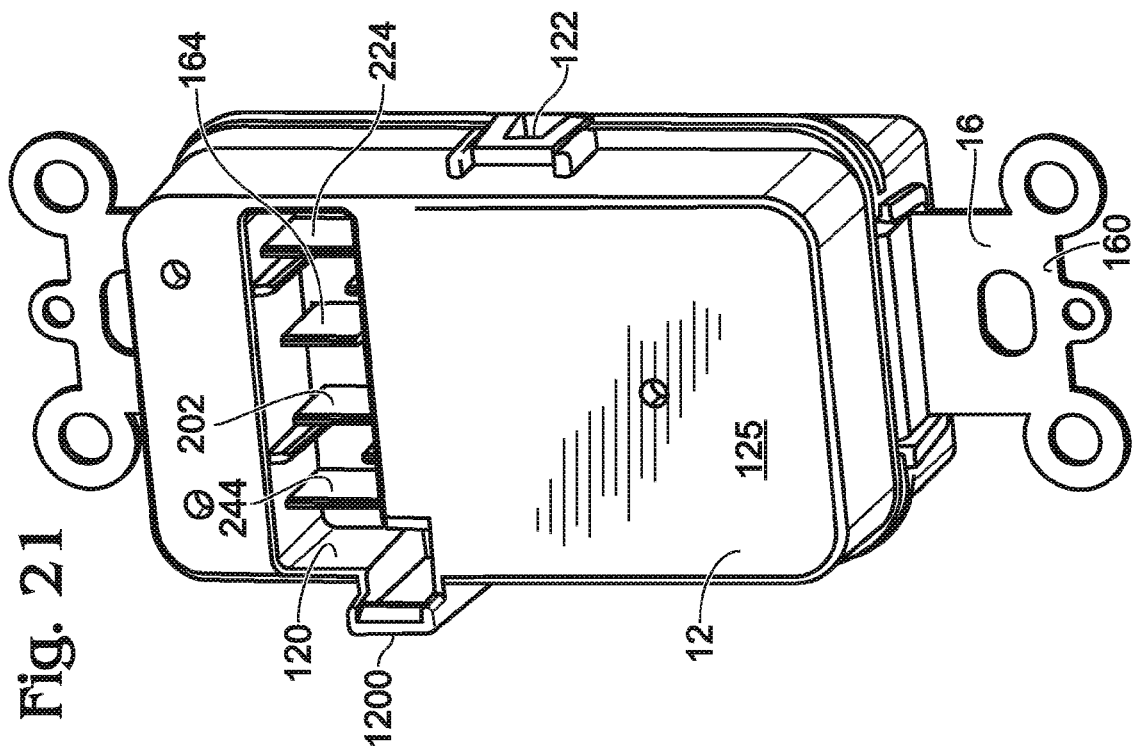
FIG. 21 is a perspective view of a back portion of the rocker switch device depicted in FIG. 18.

Referring to FIG. 21, a perspective view of a back portion of the rocker switch device 10 depicted in FIG. 18 is shown. The receptacle 120 is positioned between the back body centroid and the upper end (in this view) of the back body 12. As before, the device blade contacts (244, 202, 164, 224) are arranged in row and parallel with each other. As noted before, the device contacts within the connector arrangement 120 may be implemented using any suitable geometry and may be recessed within a receptacle or disposed in a plane above the rear major surface 125 of the back body 12. This embodiment also includes female latch mechanism 1200 which is similarly to the one previously described.

FIG. 22 is a perspective view of an electrical wiring system 100 of the present invention featuring the rocker switch depicted in FIG. 18. In this view, the connector device 50 is inserted and latched within receptacle 120 of device 10.

Referring to FIG. 23, a latitudinal cross-section of the system depicted in FIG. 22 is disclosed. From left to right, the traveler device contact 244 extends downwardly from the floor of the receptacle 120 and is engaged by the traveler connector contact 520 coupled to traveler wire 52. Device common contact 202 extends from the stationary common member 20 into the receptacle 120 and is engaged by common connector contact 540, which in turn, is connected to common wire 54. Device ground contact 164 extends from the ground strap 16 and is engaged by connector ground contact 560. Of course, the connector ground contact 560 is connected to ground wire 56. Finally, at the right end of the drawing, the second device traveler contact 224 is engaged by the second connector traveler contact 520, which is connected to the second traveler wire 52.

Figure 24:
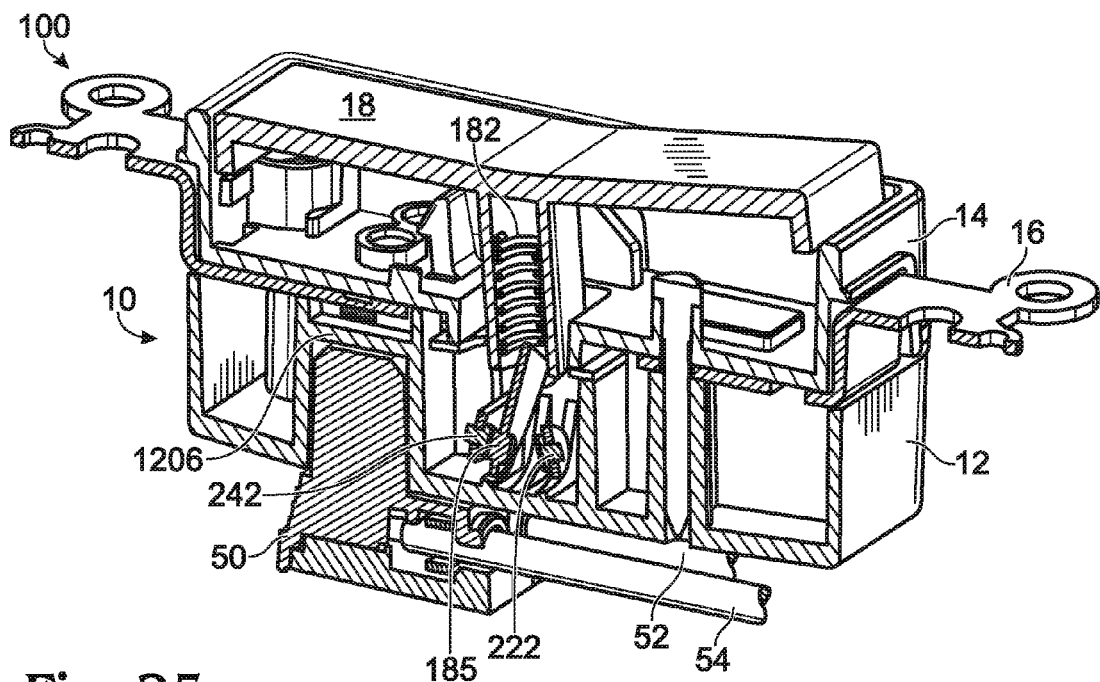
FIG. 24 is a longitudinal cross-section of the system depicted in FIG. 22.

Referring to FIG. 24, a longitudinal cross-section of the system depicted in FIG. 22 is disclosed. Again, the connector device 50 is fully inserted and latched into receptacle 120. The "nose" of the connector 50 does not abut the strap 16. Receptacle floor 1206 is disposed between the strap 16 and the device contact blades to prevent the blades from shorting out to the strap. In an alternate embodiment, the floor 1206 may be omitted if the strap has one or two side rails instead of being straight-through. The view provided by FIG. 10 clearly shows spring 182 being disposed between paddle switch 18 and pivot contact 185 which is engaged with traveler contact 242.

Figure 25:
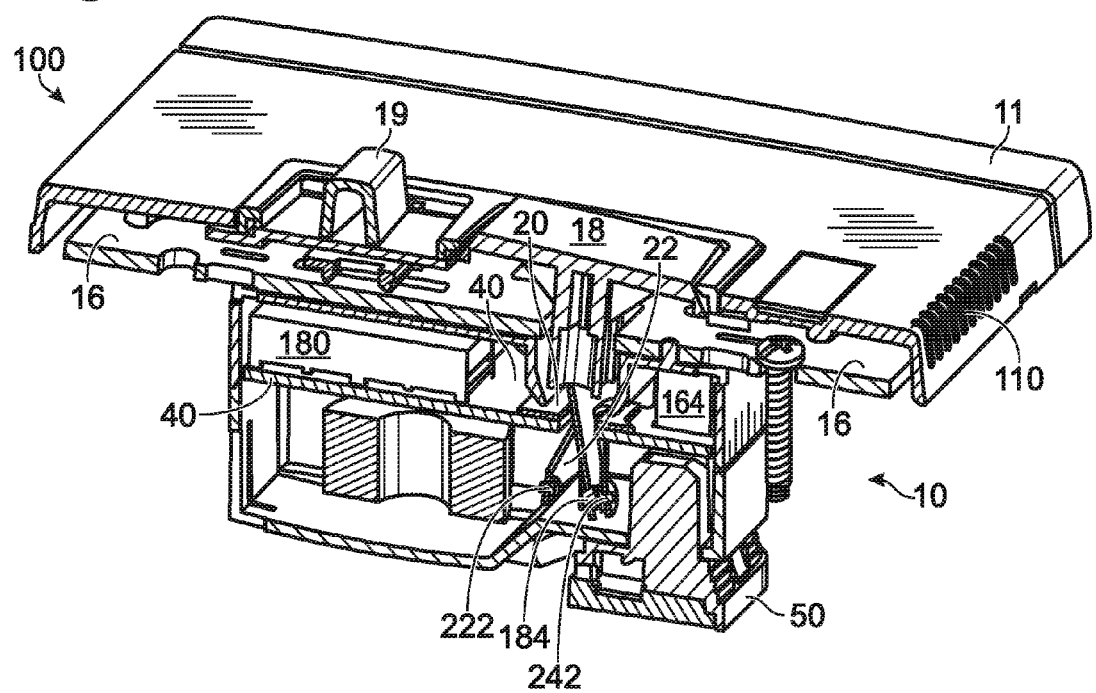
FIG. 25 is a longitudinal cross-section view of a dimmer switch device in accordance with another alternate embodiment of the present invention.

As embodied herein and depicted in FIG. 25, a longitudinal cross-section view of a dimmer switch device 10 in accordance with another alternate embodiment of the present invention is disclosed. In this embodiment, a cover plate 11 is disposed over a heat sink/ground plate 16. The cover plate includes vents 110 disposed at either end thereof. A preset switch 18 and a dimmer control 19 are disposed within a central aperture of the cover plate 11. The dimmer control is coupled to a dimmer control circuit 180 disposed on printed circuit board 40. The preset switch 18 is a three-way switch. The pivot contact 185 is shown as being engaged with traveler contact 242 and not engaged with traveler contact 222. Reference is made to U.S. patent application Ser. No. 11/343,102, which is incorporated herein by reference as though fully set forth in its entirety, for a more detailed explanation of a dimmer switch.

Referring to FIG. 26, a perspective view of a connector device contact for an alternative embodiment of connector device depicted in FIG. 9. As noted previously, the connector device shown in FIG. 9 and elsewhere in this disclosure is directed to a right angle connector. The contact 540 shown in FIG. 26 is for a straight, or 180° connector whereby the common wire 54, for example, is essentially perpendicular to the rear major surface of the back body 12 when the connector 50 is inserted and latched into the receptacle 120 in accordance with the teachings of the present invention.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening.

The recitation of ranges of values herein are merely intended to serve as a shorthand method of referring individually to each separate value falling within the range, unless otherwise indicated herein, and each separate value is incorporated into the specification as if it were individually recited herein.

All methods described herein can be performed in any suitable order unless otherwise indicated herein or otherwise clearly contradicted by context. The use of any and all examples, or exemplary language (e.g., "such as") provided herein, is intended merely to better illuminate embodiments of the invention and does not impose a limitation on the scope of the invention unless otherwise claimed.

No language in the specification should be construed as indicating any non-claimed element as essential to the practice of the invention.

It will be apparent to those skilled in the art that various modifications and variations can be made to the present invention without departing from the spirit and scope of the invention. There is no intention to limit the invention to the specific form or forms disclosed, but on the contrary, the intention is to cover all modifications, alternative constructions, and equivalents falling within the spirit and scope of the invention, as defined in the appended claims. Thus, it is intended that the present invention cover the modifications and variations of this invention provided they come within the scope of the appended claims and their equivalents.

What is claimed is:

1. An electrical wiring system for use in an AC electrical power distribution circuit including at least one first AC power conductor disposed between an upstream AC power element and a device box and at least one second AC power conductor disposed between the device box and a downstream AC power element, the at least one first AC power conductor and the at least one second AC power conductor being routed into an interior portion of the device box and accessible via a front open face of the device box, the system comprising:

a connector device including a connector housing having a plurality of connector contacts disposed therein, the plurality of connector contacts being coupled to termination structures configured to couple the at least one first AC power conductor and the at least one second AC power conductor to corresponding contacts of the plurality of connector contacts; and an electrical wiring device including a device housing having a front portion and a rear portion, the front portion including at least one user-accessible control element disposed thereon, the at least one user-accessible control element being coupled to an electrical switch mechanism disposed in the device housing and coupled to a plurality of device contacts, the plurality of device contacts being accessible by way of a device connection arrangement formed in the rear portion of the device housing, the plurality of device contacts being configured to mate with the plurality of connector contacts when the connector device is coupled to the device connection arrangement.

2. The system of claim 1, wherein a first contact of the plurality of connector contacts is configured to be coupled to a hot AC conductor, a second contact of the plurality of connector contacts is configured to be coupled to a first traveler conductor, and a third contact of the plurality of connector contacts is configured to be coupled to a second traveler conductor.

3. The system of claim 2, wherein a fourth contact of the plurality of connector contacts is configured to be coupled to a ground conductor.

4. The system of claim 1, wherein the upstream AC power element includes an AC power distribution point in an AC branch electrical circuit.

5. The system of claim 4, wherein the upstream AC power element includes a circuit breaker in a load center panel.

6. The system of claim 1, wherein the upstream AC power element includes an electrical wiring device.

7. The system of claim 1, wherein the downstream AC power element includes an electrical load.

8. The system of claim 1, wherein the downstream AC power element includes an electrical wiring device.

9. The system of claim 1, wherein the plurality of connector contacts includes at least four connector contacts.

10. The system of claim 1, wherein the at least one user-accessible control element includes a toggle switch.

11. The system of claim 1, wherein the at least one user-accessible control element includes a paddle switch.

12. The system of claim 1, wherein the at least one user-accessible control element includes a dimmer control mechanism.

13. The system of claim 1, wherein the electrical switch mechanism includes a single pole single throw switch mechanism.

14. The system of claim 1, wherein the electrical switch mechanism includes a single pole double throw switch mechanism.

15. The system of claim 1, wherein the device connection arrangement includes a power connection receptacle formed in the rear portion, the plurality of device contacts being recessed within the power connection receptacle.

16. The system of claim 15, wherein the connector housing is at least partially disposed within the power connection receptacle when the plurality of device contacts are mated with the plurality of connector contacts.

17. The system of claim 1, wherein the electrical switch mechanism includes a stationary common member having at least one fixed contact disposed thereon and a common device contact of the plurality of device contacts, the electrical switch mechanism further including at least one movable switch member having a flex arm portion coupled to a stationary portion, the flex arm including a movable contact disposed at an end portion thereof, the stationary portion including a traveler device contact of the plurality of device contacts, the movable contact and the at least one fixed contact being opened or closed in accordance with a position of the at least one user-accessible control element.

18. The system of claim 17, wherein the stationary portion includes a side-rail connected to the flex arm at a first end thereof, the side-rail being characterized by a rail length greater than a length of the flex arm, the side-rail including the traveler device contact disposed at a second end thereof.

19. The system of claim 17, wherein the stationary common member includes a first fixed contact and a second fixed contact, the common device contact extending therebetween, the at least one movable switch member comprising a first movable switch member including a first stationary portion coupled to a first flex arm portion, the first flex arm portion including a first movable contact disposed at an end portion thereof, the at least one movable switch member further comprising a second movable switch member including a second stationary portion coupled to a second flex arm portion, the second flex arm portion including a second movable contact disposed at an end portion thereof, the first movable contact corresponding to the first fixed contact and the second movable contact corresponding to the second fixed contact.

20. The system of claim 19, wherein the first stationary portion includes a first side-rail connected to the first flex arm at one end thereof, the first side-rail being characterized by a rail length greater than a length of the first flex arm, the first side-rail including a first traveler device contact disposed at an end opposite the one end thereof, the second stationary portion including a second side-rail connected to the second flex arm at one end thereof, the second side-rail being characterized by a rail length greater than a length of the second flex arm, the second side-rail including a second traveler device contact disposed at an end opposite the one end thereof.

21. The system of claim 20, wherein the common device contact is disposed between the first traveler device contact and the second traveler device contact within the device connection arrangement.

22. The system of claim 20, further comprising a ground device contact disposed between the first traveler device contact and the second traveler device contact.

23. The system of claim 1, wherein the electrical switch mechanism is coupled to an electric circuit assembly disposed within the device housing, the electric circuit assembly being selected from a group of electric circuit assemblies including a GFCI, a dimmer control, or a user-accessible receptacle accessible via the front portion.

24. The system of claim 1, wherein the device connection arrangement includes a power connection receptacle formed in the rear portion at an end portion thereof, the plurality of device contacts being recessed within the power connection receptacle, the power connection receptacle being separated from the electric switch mechanism by a non-conductive isolating member.

25. The system of claim 1, further comprising a latching mechanism configured to latch the connector assembly to the device connection arrangement when the plurality of connector contacts are mated with the plurality of device contacts.

26. The system of claim 25, wherein the latching mechanism includes a flexible latch member configured to mate with a stationary latch member.

27. The system of claim 1, further comprising a pull switch mechanism configured to mate with the connector assembly when the connector assembly is not connected to the device connection arrangement, the pull switch mechanism including a plurality of pull switch contacts disposed within a pull switch housing, the plurality of pull switch contacts being shorted together, the plurality of pull switch contacts being configured to mate with predetermined ones of the plurality of connector contacts, the plurality of pull switch contacts and the plurality of connector contacts being inaccessible to a user when the pull switch mechanism is mated with the connector device.

28. The system of claim 27, wherein the pull switch mechanism is configured to provide a hot connection between the upstream AC power element and the downstream AC power element when the AC electrical power distribution circuit is energized.

29. The system of claim 27, wherein the pull switch and the connector device further comprise a latch mechanism configured to latch the pull switch and the connector device when the pull switch mechanism is mated with the connector device.

30. The system of claim 1, wherein the at least one first AC power conductor includes a hot line conductor configured to be coupled to a hot line connector contact of the plurality of connector contacts and a neutral line conductor configured to be coupled to a neutral line connector contact of the plurality of connector contacts, and the at least one second AC power conductor includes a load hot conductor configured to be coupled to a load hot connector contact of the plurality of connector contacts and a load neutral conductor configured to be coupled to a load neutral connector contact of the plurality of connector contacts.

31. The system of claim 30, wherein the electrical switch mechanism includes a circuit interrupting mechanism configured to couple the hot line conductor with the load hot conductor and couple the neutral line conductor with the load neutral conductor in a reset state, and decouple the hot line conductor from the load hot conductor and decouple the neutral line conductor from the load neutral conductor in a tripped state.

32. The system of claim 1, wherein the termination structures include twist-on wire connectors.

33. The system of claim 1, wherein the electrical switch mechanism comprises a common member including a cradle portion formed therein and a common device contact of the plurality of device contacts, a movable pivot contact being disposed within the cradle portion, the electrical switch mechanism further including at least one stationary contact structure including a fixed contact and a traveler device contact of the plurality of device contacts, the movable pivot contact being configured to switchably engage the fixed contact in accordance with a position of the at least one user-accessible control element.

34. The system of claim 33, wherein the at least one user-accessible control element includes a paddle switch coupled to the movable pivot contact.

35. The system of claim 33, wherein the at least one stationary contact structure includes a first stationary contact structure having a first stationary contact and a first traveler device contact and a second stationary contact structure having a second stationary contact and a second traveler device contact, the movable pivot contact being configured to switchably engage the first fixed contact or the second fixed contact in accordance with a position of the at least one user-accessible control element.

36. The system of claim 1, wherein the electrical switch mechanism comprises a common member including a base portion connected to a common device contact of the plurality of device contacts, a first common flex arm and a second common flex arm extending from the base portion, the first common flex arm and the second common flex arm including at end portions thereof a first movable common contact and a second movable common contact, respectively, the electrical switch mechanism including a first stationary traveler contact structure having a first stationary contact and a first traveler device contact of the plurality of device contacts, the electrical switch mechanism further including a second stationary traveler contact structure having a second stationary contact and a second traveler device contact of the plurality of device contacts.

37. The system of claim 1, wherein the electrical switch mechanism comprises a first switch structure including a fixed first contact and a first device contact of the plurality of device contacts, the electrical switch mechanism further including a second switch structure including a movable second contact and a second device contact of the plurality of device contacts, the moveable second contact being and the fixed contact being closed or open in accordance with a position of the at least one user-accessible control element.

38. An electrical wiring system for use in an AC electrical power distribution circuit including a first plurality of AC power conductors disposed between an upstream AC power element and a device box and a second plurality of AC power conductors disposed between the device box and a downstream AC power element, the first plurality of AC power conductors and the second plurality of AC power conductors being routed into an interior portion of the device box and accessible via a front open face of the device box, the system comprising:

a connector device including a connector housing having a plurality of connector contacts disposed therein, the plurality of connector contacts being coupled to termination structures configured to couple the first plurality of AC power conductors and the second plurality of AC power conductors to corresponding contacts of the plurality of connector contacts; and an electrical wiring device including a device housing having a front portion and a rear portion, the front portion including at least one user-accessible control element disposed thereon, the at least one user-accessible control element being coupled to an electrical circuit mechanism disposed in the device housing and coupled to a plurality of device contacts, the electrical circuit mechanism being configured to be switched between a first circuit state and a second circuit state, the plurality of device contacts being accessible by way of a device connection arrangement formed in the rear portion of the device housing, the plurality of device contacts being configured to mate with the plurality of connector contacts when the connector device is coupled to the device connection arrangement.

39. The system of claim 38, wherein the electrical circuit mechanism is configured to switchably control a light fixture.

40. The system of claim 38, wherein the plurality of device contacts include a line hot contact, a line neutral contact, a load hot contact and a load neutral contact.

41. The system of claim 38, wherein the electrical circuit mechanism includes a circuit interrupter, and the first circuit state includes a reset state and the second circuit state includes a tripped state.

42. The system of claim 38, wherein the device connection arrangement includes a power connection receptacle formed in the rear portion at an end portion thereof, the plurality of device contacts being recessed within the power connection receptacle, the power connection receptacle being separated from the electrical circuit mechanism by a non-conductive isolating member.

* * * * *